United States Patent
Dong et al.

(10) Patent No.: US 12,176,033 B2
(45) Date of Patent: Dec. 24, 2024

(54) MEMORY DEVICE, OPERATING METHOD THEREOF, SYSTEM, AND STORAGE MEDIUM

(71) Applicant: YANGTZE MEMORY TECHNOLOGIES CO., LTD., Wuhan (CN)

(72) Inventors: Zhipeng Dong, Wuhan (CN); Ying Cui, Wuhan (CN); Li Xiang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 161 days.

(21) Appl. No.: 17/951,794

(22) Filed: Sep. 23, 2022

(65) Prior Publication Data

US 2024/0079056 A1 Mar. 7, 2024

Related U.S. Application Data

(63) Continuation of application No. PCT/CN2022/117280, filed on Sep. 6, 2022.

(51) Int. Cl.
 *G11C 16/04* (2006.01)
 *G11C 16/08* (2006.01)
 *G11C 16/14* (2006.01)

(52) U.S. Cl.
 CPC .......... *G11C 16/0433* (2013.01); *G11C 16/08* (2013.01); *G11C 16/14* (2013.01)

(58) Field of Classification Search
 CPC ...... G11C 16/0433; G11C 16/08; G11C 16/14
 See application file for complete search history.

(56) References Cited

U.S. PATENT DOCUMENTS

| | | | |
|---|---|---|---|
| 10,878,907 B1 | 12/2020 | Chibvongodze et al. | |
| 10,910,060 B1 * | 2/2021 | Wu | G11C 16/08 |
| 11,282,581 B1 * | 3/2022 | Chen | G11C 16/08 |

(Continued)

FOREIGN PATENT DOCUMENTS

| | | |
|---|---|---|
| CN | 103177762 A | 6/2013 |
| CN | 112435704 A | 3/2021 |

(Continued)

OTHER PUBLICATIONS

International Search Report issued in corresponding International Application No. PCT/CN2022/117280, mailed Jan. 18, 2023, 4 pages.

*Primary Examiner* — Ajay Ojha
(74) *Attorney, Agent, or Firm* — BAYES PLLC

(57) ABSTRACT

A memory device, an operating method thereof, a system, and a non-transitory tangible storage medium are disclosed. The memory device includes a source line (SL), a bit line (BL), a memory string, a word line, a select line and a peripheral circuit. The memory string includes a memory cell and a select transistor including a storage layer. The word line is coupled to the memory cell. The select line is coupled to the select transistor. The peripheral circuit is coupled to the SL, the BL, the select line, and the word line. The peripheral circuit is configured to: apply a first voltage to the select line; and apply a second voltage to the SL and/or the BL, in which a first peak level of the first voltage is greater than a second peak level of second voltage.

20 Claims, 21 Drawing Sheets

(56) References Cited

U.S. PATENT DOCUMENTS

| | | |
|---|---|---|
| 2007/0253253 A1 | 11/2007 | Aritome |
| 2014/0050025 A1 | 2/2014 | Tsao et al. |
| 2014/0112072 A1 | 4/2014 | Tsao et al. |
| 2017/0140829 A1 | 5/2017 | Park et al. |

FOREIGN PATENT DOCUMENTS

| | | |
|---|---|---|
| CN | 114067890 A | 2/2022 |
| TW | 201203257 A | 1/2012 |
| TW | 202211022 A | 3/2022 |

* cited by examiner

MEMORY DEVICE, OPERATING METHOD THEREOF, SYSTEM, AND STORAGE MEDIUM

CROSS-REFERENCE TO RELATED APPLICATIONS

This application is a continuation of International Application No. PCT/CN2022/117280, filed on Sep. 6, 2022, entitled "MEMORY DEVICE, OPERATING METHOD THEREOF, SYSTEM, AND STORAGE MEDIUM," which is hereby incorporated by reference in its entirety.

BACKGROUND

The present disclosure relates to a memory device, an operating method thereof, a system, and a non-transitory tangible storage medium.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase, where program (write) and erase operations can change the threshold voltage of corresponding memory cells to desired levels (e.g., values). For NAND Flash memory, an erase operation can be performed at the block level, and a program operation or a read operation can be performed at the page level.

SUMMARY

In one aspect, embodiments of the present disclosure provide a memory device. The memory device comprising: a source line (SL), bit line (BL), a memory string, a word line, a select line, and a peripheral circuit coupled to the memory string. The memory string comprising: a memory cell, a select transistor comprising a storage layer. The word line is coupled to the memory cell, the select line is coupled to the select transistor. The peripheral circuit is configured to: apply a first voltage to the select line, apply a second voltage to the SL and/or the BL, and a first peak level of the first voltage is greater than a second peak level of second voltage.

In another aspect, embodiments of the present disclosure provide a system. The system comprising: a memory controller coupled to a memory device and configured to transmit a command to the memory device. The memory device comprising: a source line (SL), bit line (BL), a memory string, a word line, a select line, and a peripheral circuit coupled to the memory string. The memory string comprising: a memory cell, a select transistor comprising a storage layer. The word line is coupled to the memory cell, the select line is coupled to the select transistor. The peripheral circuit is configured to: in response to receiving the command, apply a first voltage to the select line, apply a second voltage to the SL and/or the BL, and a first peak level of the first voltage is greater than a second peak level of second voltage.

In a further aspect, embodiments of the present disclosure provide a method for operating a memory device. The memory device comprising: a source line (SL), a bit line (BL), a memory string, a word line and a select line. The memory string comprising: a memory cell, a select transistor comprising a storage layer. The word line is coupled to the memory cell, the select line is coupled to the select transistor. The method comprising: apply a first voltage to the select line; and apply a second voltage to the SL and/or the BL, wherein a first peak level of the first voltage is greater than a second peak level of second voltage.

In a further aspect, embodiments of the present disclosure provide a non-transitory tangible storage medium storing a set of instructions is provided, where upon being implemented by a controller, the set of instructions cause a peripheral circuit of a memory device to: apply a first voltage to a select line coupled to a select transistor of a memory string of the memory device; and apply a second voltage to a source line (SL) and/or a bit line (BL) of the memory device, in which a first peak level of the first voltage is greater than a second peak level of second voltage.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
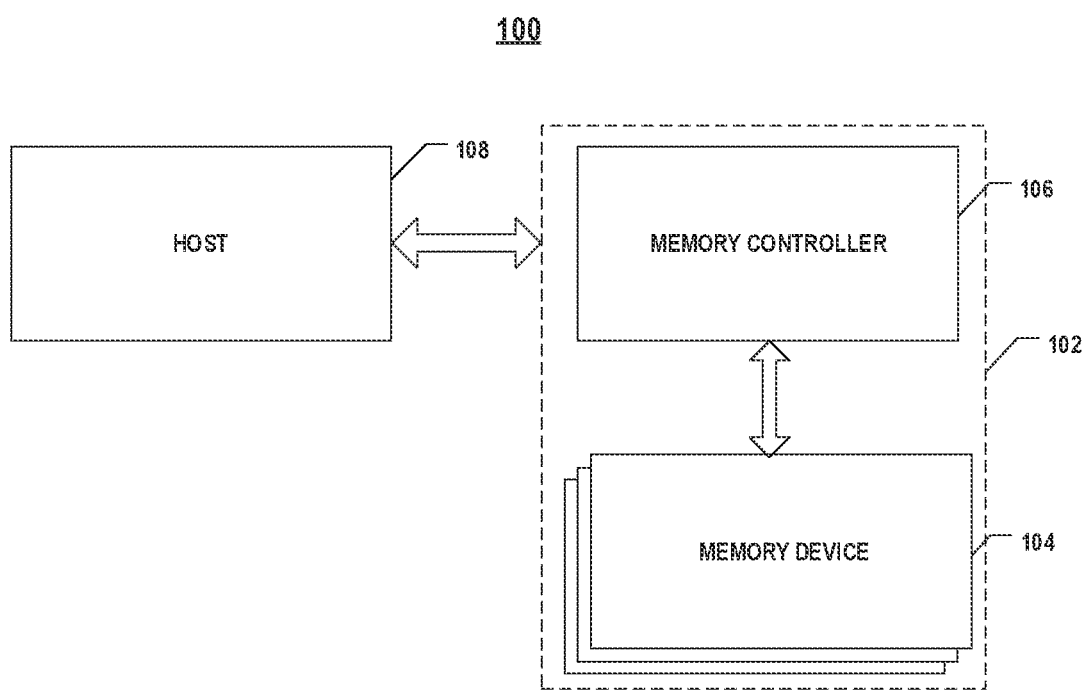
FIG. 1 illustrates a block diagram of an exemplary system including a memory device, according to some aspects of the present disclosure.

Embodiments of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer there between, and that "above" or "over" not only means the meaning of "above" or "over" something but can also include the meaning it is "above" or "over" something with no intermediate feature or layer there between (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatented. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, there above, and/or there below. A layer can include multiple layers. For example, an interconnect layer can include one or more conductor and contact layers (in which interconnect lines and/or via contacts are formed) and one or more dielectric layers.

As used herein, the term "memory device" refers to a semiconductor device with vertically or laterally oriented strings of memory cell transistors (referred to herein as "memory strings," such as NAND memory strings) on a horizontally-oriented substrate so that the memory strings extend in the vertical direction or horizontal direction with respect to the substrate. As used herein, the term "vertical/vertically" means perpendicular to the lateral surface of a substrate, the term "horizontal/horizontally" means parallel to the lateral surface of a substrate.

As the demand for storages with a higher capacity continues to increase, 3D NAND memory devices with an increased number of levels (e.g., memory layers or gate conductive layers) are employed. Memory strings are formed extending through the memory layers, creating arrays of memory cells. To perform an erase operation to the memory cells, holes are commonly injected into the semiconductor channels of the memory strings to sustain a positive potential in the memory strings. The holes can be generated from P-wells under the memory strings. However, the increased number of levels in 3D NAND memory devices makes it more difficult to timely and effectively transport the holes from the bottom to the top of the semiconductor channel. As a result, fluctuation can occur in the erase operation, and some memory cells are not effectively erased. As a remedy, gate-induce-drain-leakage (GIDL)-assisted body biasing for erase operation (or GIDL erase operation) has been used to improve the erase efficiency and effectiveness. In a typical GIDL erase operation, the bit line and the source line electrically connected to a memory string are each applied with a high positive voltage so that holes are generated and injected from the ends, e.g., from beyond a drain-select gate (DSG) and a source-select gate (SSG), of the memory string into the semiconductor channel.

However, operation performance of a 3D NAND memory device, a select transistor of which has a storage layer, can decline (such as the threshold voltage Vt of the select transistor can shift down and the efficiency of GIDL erase can be lowered), especially after erase operations are performed many times. Details can be found in descriptions related to FIG. 6D and descriptions related to the top picture of FIG. 10, and no further descriptions will be given here for the sake of clarity.

Details of the reasons causing the above-mentioned performance decline are given in the following. For example, holes can gain energy and tunneling into the trap layers of the select transistor (e.g., DSG transistor and/or SSG transistor) due to band to band tunneling, which can change the threshold voltage (Vt) of the select transistor (e.g., DSG transistor and/or SSG transistor), and this can affect the operation performance of the select transistor. During GIDL erase operation, extra holes are tunneled into the trap layers of the select transistor and can change the Vt of the select transistor to an undesired level, and thus, e.g., many times of the GIDL erase, Vt of the select transistor can shift down and/or the efficiency of GIDL erase can be lowered. For example, during the GIDL erase operation, extra holes can be generated and accelerated by electric fields, and thus hot holes can be generated for hot hole injection. In some implementation, the select transistor can be a DSG transistor or a SSG transistor. In some implementation, the select transistor can include both the DSG transistor and SSG transistor.

To address one or more of the aforementioned issues, embodiments of the present disclosure provide a memory device, a system including the memory device, and a method for operating the memory device. The memory device includes: a source line (SL) and a bit line (BL); a memory string including a memory cell, and a select transistor including a storage layer; a word line coupled to the memory cell; a select line coupled to the select transistor; a peripheral circuit coupled to the SL, the BL, the select line, and the word line; in which, the peripheral circuit is configured to: apply a first voltage to the select line; apply a second voltage to the SL and/or the BL; and a first peak level of the first voltage is greater than a second peak level of second voltage. For example, the common source line (SL) and the bit line (BL) are respectively coupled to the memory string. For example, by applying the first voltage to the select line, the threshold voltage Vt of the select transistor can be increased. For example, the second voltage is a ground voltage, and the first peak level of the first voltage is greater than a pass voltage. For example, by applying the first voltage to the select line, the efficiency of erase operation of the memory device can be improved.

For example, the first peak level of the first voltage is the maximum voltage value of the first voltage; for example, in case where the first voltage is a pulse, and the first peak level of the first voltage is the maximum voltage value of the pulse; for another example, in case where the first voltage is substantially a constant value, and the first peak level of the first voltage is the constant value. The peak level of the other voltage (e.g., second voltage) described in embodiments of the present disclosure has same or similar meaning, and no further descriptions will be given.

It should be understood that, embodiments of the present disclosure are not limited to the case where the first peak level of the first voltage is greater than the second peak level of second voltage, in some implementation, by allowing the first voltage (rising and failing edges are excluded) to be greater than the second voltage (rising and failing edges are excluded), the threshold voltage Vt of the select transistor can be increased. For example, same or similar modification can be applied to comparisons of other voltages described in embodiments of the present disclosure.

For example, the first voltage and the second voltage can be applied during an erase operation, for example, during a pre-program phase of the erase operation (for example, GIDL erase operation), and in this example, no extra time is required for applying the first voltage and the second voltage, and thus the duration time of the erase operation is not degraded. For another example, the first voltage and the second voltage can be applied at the beginning or the end of an erase operation. For further another example, the first voltage and the second voltage can be applied during any suitable time periods not performed with a read operation, a program operation or an erase operation.

For example, embodiments of the present disclosure introduce a method for operating a memory device, which can be performed, e.g., during an erase operation of the memory device (e.g., 3D NAND memory device), and can, e.g., improve erase efficiency and/or effectiveness. For example, the method for operating the memory device can be performed alone or in combination with an erase operation (e.g., a GIDL erase operation). The meaning that "the method can be performed alone" can be that the time period for performing the method is not overlapped with time periods for performing other operations (e.g., a read operation, a program operation or an erase operation). The meaning that "the method can be performed in combination with an erase operation" can be that the method can be performed during the erase operation (e.g., a pre-program phase of the erase operation), such that the time period for performing the erase operation can be used to perform the method, and no extra time is required for performing the method. According to the disclosed method for operating the memory device, a first voltage V1 is applied to the select line that coupled to the select transistor, a second voltage V2 with a second peak level lower than a first peak level of the first voltage V1 is applied to the SL and/or the BL.

For example, by allowing the first peak level of the first voltage to be greater than the second peak level of second voltage, the electrons in the storage layer of the select transistor can be increased and the holes in the storage layer of the select transistor can be decreased, such that the threshold voltage Vt of the select transistor can be increased (e.g., programed to an pre-determined level or range). The first voltage V1 can be any suitable values, as long as the first voltage enables the changing (e.g., decreasing) of the threshold voltage of the select transistor. In some implementation, the first voltage V1 can be a voltage (e.g., a pre-program voltage Vpgm) which is greater than a pass voltage Vpass that can electrically turn on a transistor (e.g., an unselected transistor in a selected memory string during read operations). For example, the pre-program voltage Vpgm can program the select transistor and result in the threshold voltage Vt of the select transistor shifting up to a higher level.

In some implementation, the first voltage V1 is applied to the select line before an erase operation of the memory string.

In some implementation, the erase operation aforementioned can be a GIDL erase operation or any other erase operations based on suitable mechanism. Descriptions regarding exemplary GIDL erase operation (erase phase of the erase operation) are given in the following. During the GIDL erase operation (erase phase of the erase operation), a positive voltage is applied on the CSL and/or BL, a voltage that is smaller than the positive voltage is applied on the word line. The positive voltage and the voltage applied on the word line can be any suitable values to enable a band-to-band tunneling (BTBT) current to be generated in the semiconductor channels when the CSL and/or BL are biased. The BTBT current, e.g., the holes, can thus be moved from the location(s) where it is generated to other parts of the semiconductor channel. In some implementation, the bit line and source line coupled (e.g., electrically connected) to a memory string are each applied with a positive voltage so that holes are generated, and holes can be, e.g., injected from beyond a drain-select gate (DSG) and a source-select gate (SSG) of the memory string into the semiconductor channel. Due to the Vt of the select transistor is adjusted to a desired level, the performance of the select transistor can be improved, and thus the efficiency of the GIDL erase operation can be improved.

Embodiments of the present disclosure provide a system including a memory device according to some aspects of the present disclosure. The system may be implemented as a memory system (e.g., memory system 102 as shown in FIG. 1) or a system (e.g., system 100 as shown in FIG. 1) including a host and a memory system.

FIG. 1 illustrates a block diagram of an exemplary system 100 including a memory device according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 including a memory device 104 (e.g., one or more memory devices 104) and a memory controller 106. Host 108 can be a processor of an electronic device, such as a central processing unit (CPU), or a system-on-chip (SoC), such as an application processor (AP). Host 108 can be configured to send data to or receive data from the memory devices 104. In order to send data to or receive data from the memory devices 104, host 108 can send instructions to memory system 102 besides the data.

Figure 3:
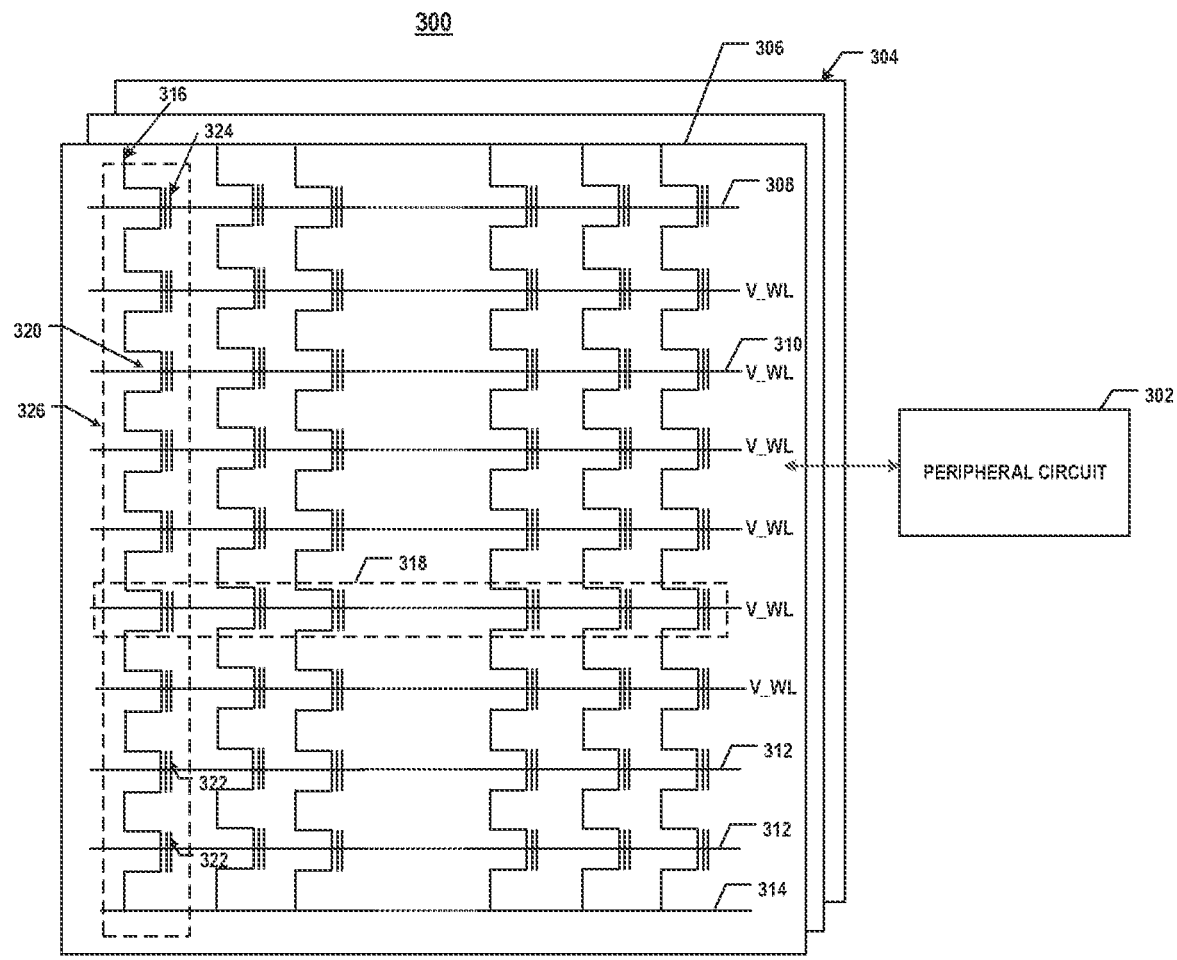
FIG. 3 illustrates a schematic diagram of a memory device including peripheral circuits, according to some aspects of the present disclosure.
Figure 4A:
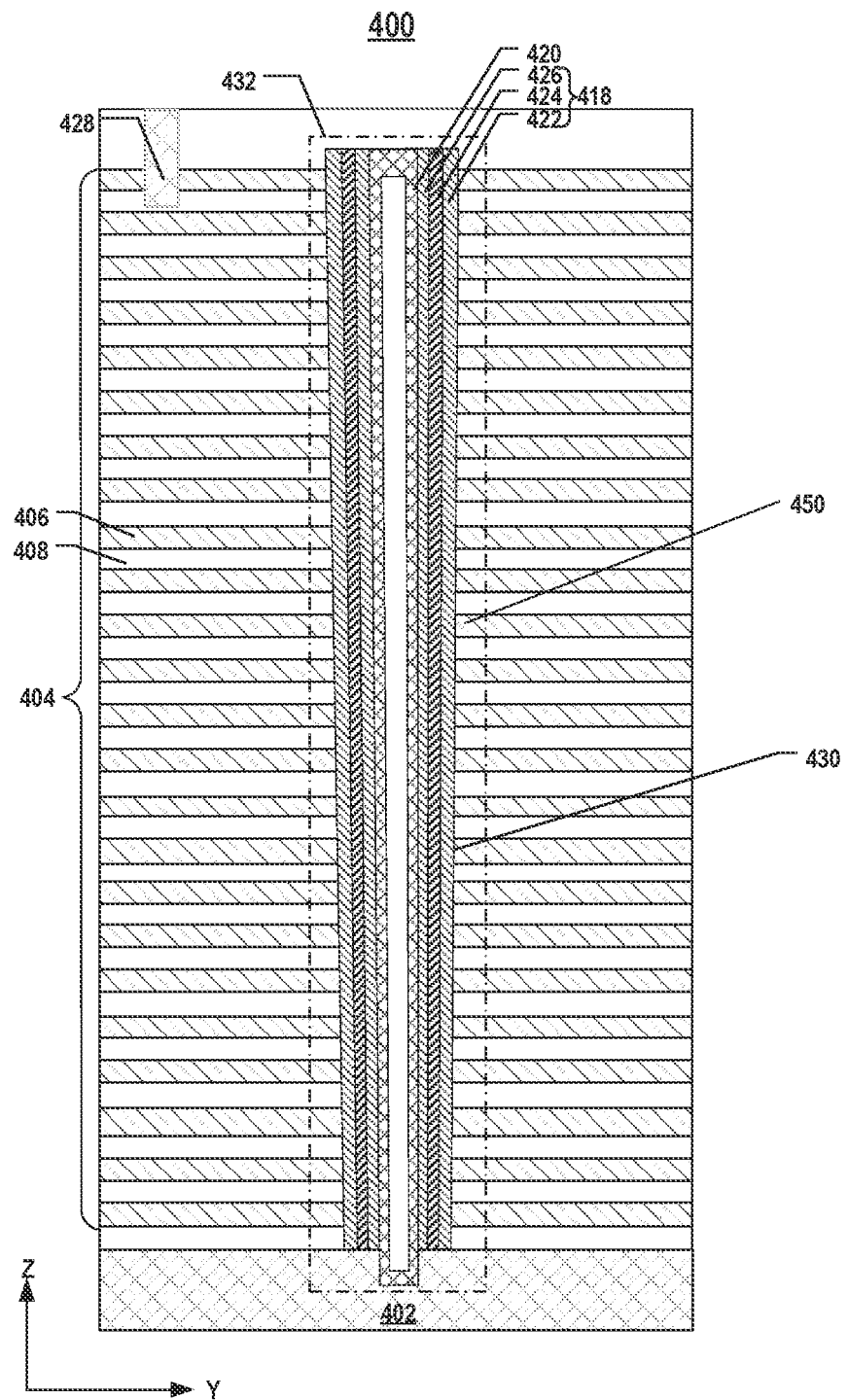
FIGS. 4A and 4B illustrate a cross-sectional view and a plan view of a memory cell array of a memory device, respectively, according to some aspects of the present disclosure.
Figure 6A:
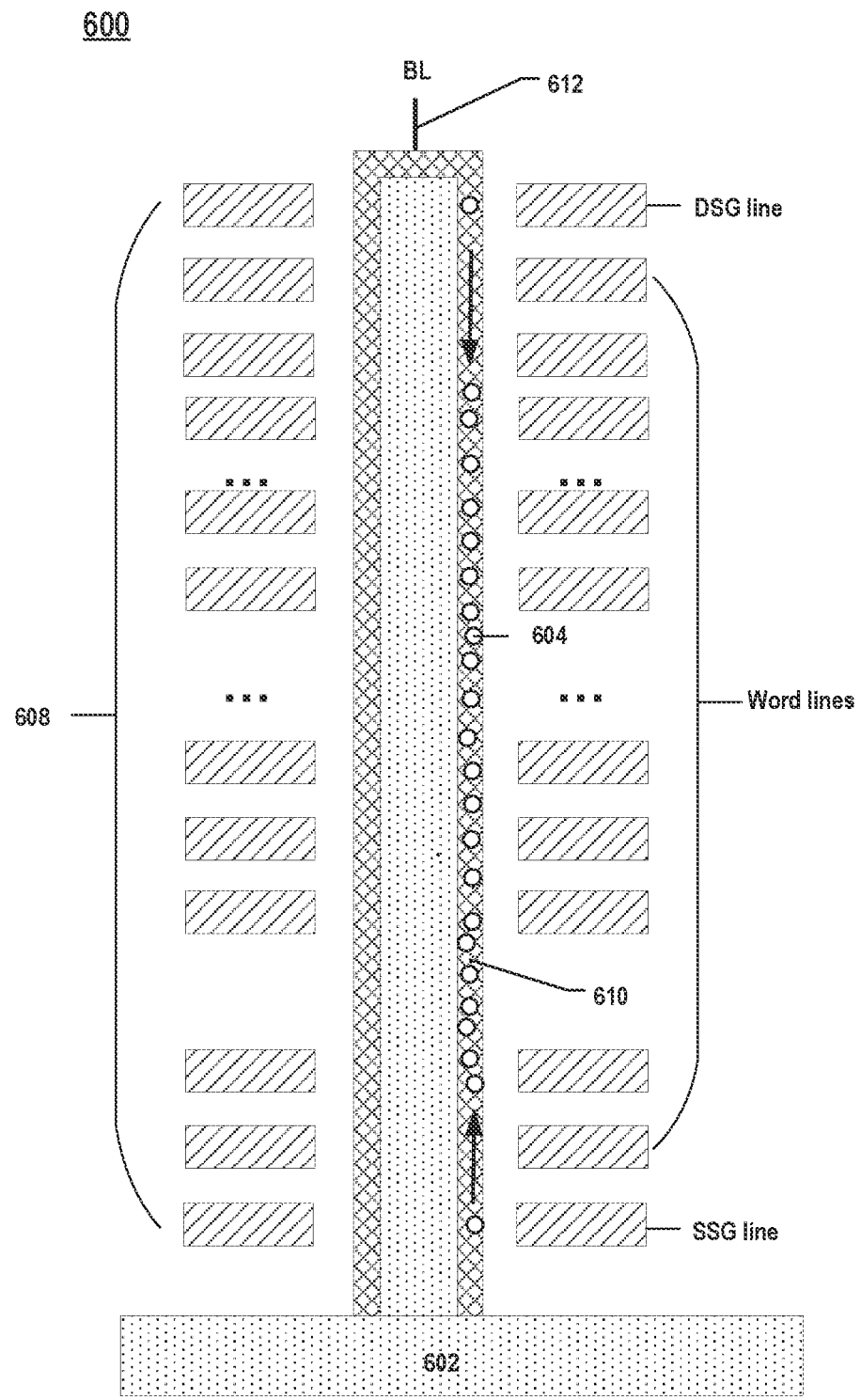
FIG. 6A illustrates an exemplary schematic diagram of a memory string of a memory device, according to some aspects of the present disclosure.
Figure 8A:
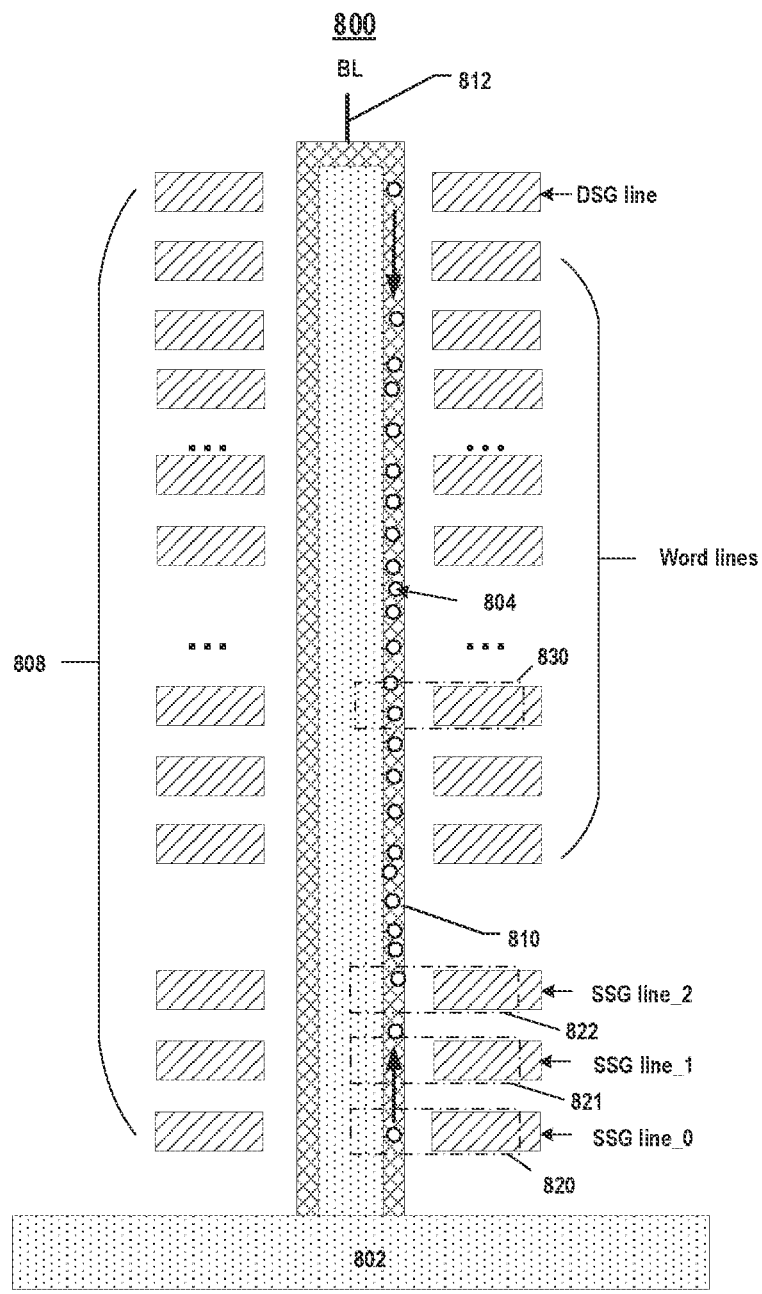
FIG. 8A illustrates an exemplary schematic diagram of a memory string of a memory device, according to some aspects of the present disclosure.
Figure 9A:
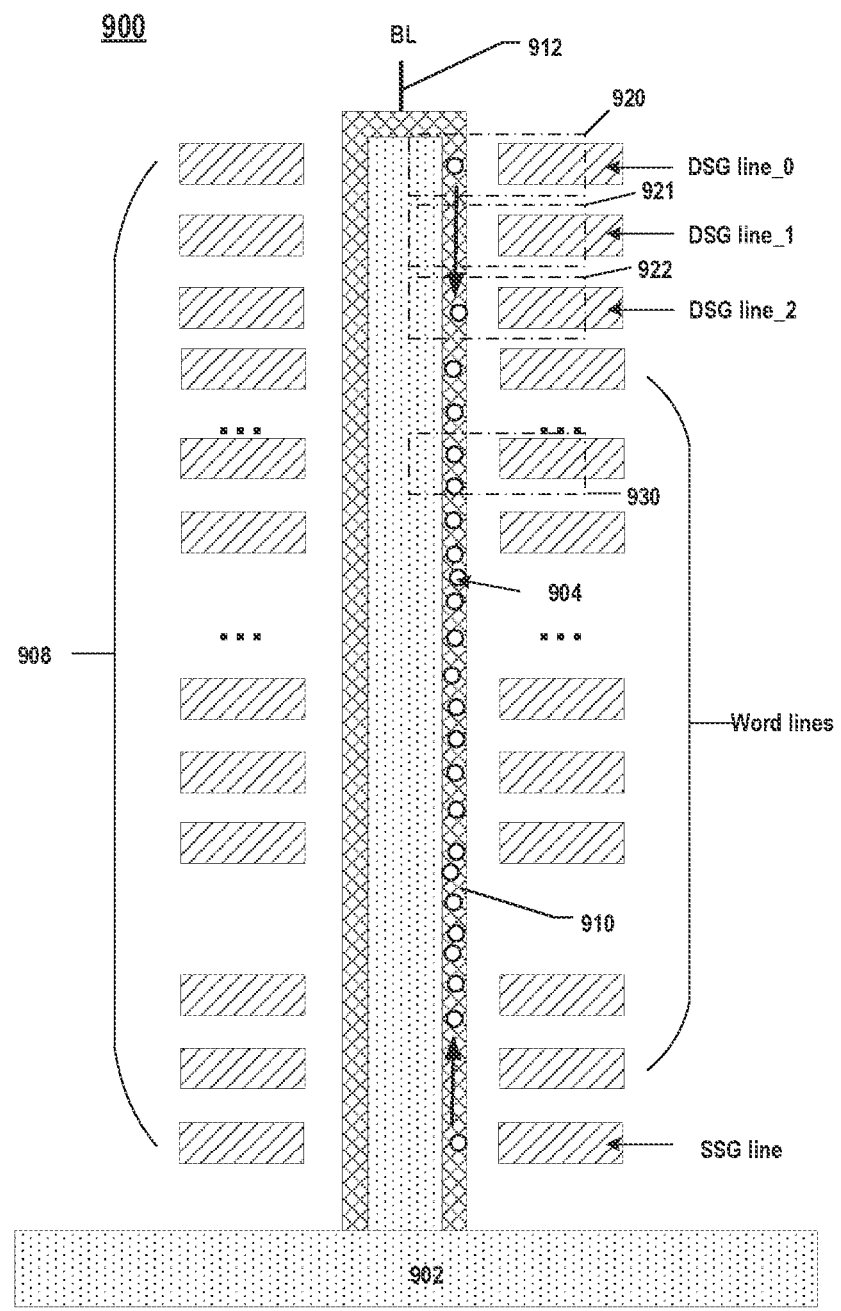
FIG. 9A illustrates an exemplary schematic diagram of a memory string of a memory device, according to some aspects of the present disclosure.

The memory device 104 can be any memory device disclosed in the present disclosure. For example, the memory device 104 can be the memory device 300 as shown in FIG. 3, the memory device 400 as shown in FIG. 4A, the memory device 600 as shown in FIG. 6A, the memory device 800 as shown in FIG. 8A, the memory device 900 as shown in FIG. 9A, or any other suitable memory device.

As disclosed below in detail, the memory device provided by embodiments of present disclosure can be, e.g., a NAND Flash memory device, and can include: a source line (SL), a bit line (BL), a memory string, a word line, a select line, and a peripheral circuit coupled to the memory string. The memory string includes a memory cell, a select transistor including a storage layer. The word line is coupled to the memory cell, the select line is coupled to the select transistor. The peripheral circuit of the memory device can apply a first voltage V1 to the select line, and apply a second voltage to the CSL and/or the BL, where a first peak level of the first voltage V1 is greater than a second peak level of second voltage V2. For example, the first voltage V1 can be used to program the select transistor and adjust the threshold voltage of the select transistor, to alleviate the performance decline caused by Vt shift (e.g., Vt decline) of the select transistor. The source line can be a common source line (CSL) or any other suitable components that can electronically connected to the source of the memory string.

As shown in FIG. 1, the memory controller 106 is coupled to the memory device 104 and the host 108, and is configured to control the memory device 104. The memory controller 106 can allow data to store in the memory device 104 and can communicate with host 108. In some implementations, the memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, the memory controller 106 is designed for operating in a high duty-cycle environment SSDs or embedded multi-media-cards (eMMCs), and used as data storage for mobile devices, such as smartphones, tablets, laptop computers, enterprise storage arrays, and the like. The memory controller 106 can be configured to control operations of memory device 104, such as read, erase, and program operations. For example, based on the instructions received from the host 108, the memory controller 106 may transmit various commands (e.g., at least one of a program command, a read command, an erase command, etc.) to the memory device 104, to control the operations of memory device 104. In some implementations, the memory controller 106 transmits an erase command to the memory device 104 to initiate an erase operation performed by the memory device 104.

In some implementations, the memory controller 106 can also be configured to manage various functions with respect to the data stored or to be stored in the memory device 104, where the functions include, but not limited to, bad-block management, garbage collection, logical-to-physical address conversion, wear leveling, etc. In some implementations, the memory controller 106 is configured to process error correction codes (ECCs) with respect to the data read from or written to the memory device 104. Any other suitable functions may be performed by the memory controller 106 as well, for example, formatting the memory device 104. The memory controller 106 can communicate with an external device (e.g., host 108) according to, e.g., a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
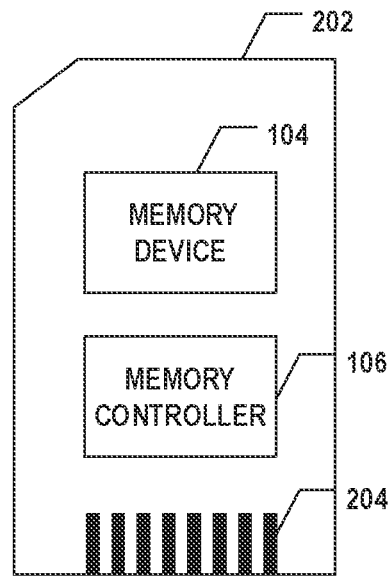
FIG. 2A illustrates a schematic diagram of a memory card having a memory device, according to some aspects of the present disclosure.
Figure 2B:
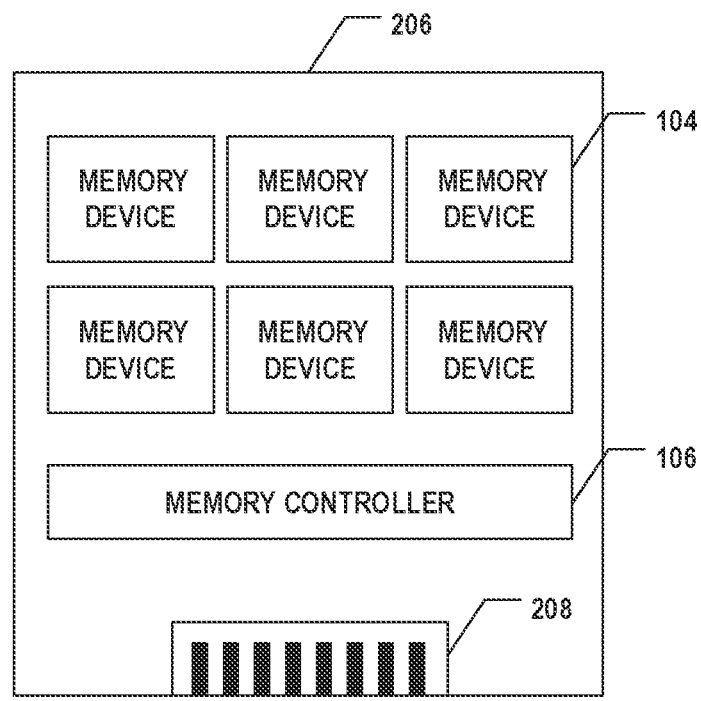
FIG. 2B illustrates a schematic diagram of a solid-state drive (SSD) having a memory device, according to some aspects of the present disclosure.

In some implementations, the memory controller 106 and the memory device 104 can be integrated into various types of storage devices. For example, the memory controller 106 and the memory device 104 can be included in the same package, such as a universal Flash storage (UFS) package or an eMMC package. That is, the memory system 102 can be implemented and packaged into different types of end electronic products. In one example as shown in FIG. 2A, the memory controller 106 and a single memory device 104 may be integrated into a memory card 202. The memory card 202 can be implemented as a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. The memory card 202 can further include a memory card connector 204 configured to couple the memory card 202 to a host (e.g., the host 108 in FIG. 1). In another example as shown in FIG. 2B, the memory controller 106 and the memory devices 104 may be integrated into an SSD 206. The SSD 206 can further include an SSD connector 208 configured to couple SSD 206 to a host (e.g., the host 108 in FIG. 1). In some implementations, the storage capacity and/or the operation speed of SSD 206 is greater than those of the memory card 202.

Embodiments of the present disclosure provide a memory device. The memory device can be any memory device disclosed in the present disclosure.

FIG. 3 illustrates a schematic diagram of an exemplary memory device 300 including peripheral circuits 302, according to some aspects of the present disclosure. The memory device 300 can be implemented as the memory device 104 in FIG. 1. The memory device 300 can include a memory cell array 304 and the peripheral circuits 302 coupled to the memory cell array 304. For example, the peripheral circuit is coupled to the SL, the BL, the select line, and the word line. The memory cell array 304 can be a NAND Flash memory cell array in which the memory cells 320 are provided in the form of an array of NAND memory strings 326 each extending, e.g., vertically as compared to a substrate (not shown in FIG. 3, see FIG. 4A or FIG. 6A). In some implementations, each NAND memory string 326 includes a plurality of memory cells 320 coupled in series and stacked vertically. For example, the memory cell 320 (e.g., each memory cell 320) can hold a continuous, analog value, such as an electrical voltage or charge, which depends on the number of electrons trapped within a region of memory cell 320. For example, the memory cell 320 (e.g., each memory cell 320) can be either a floating-gate type memory cell (e.g., a floating-gate transistor) or a charge-trap type memory cell (e.g., a charge-trap transistor).

In some implementations, the memory cell 320 (e.g., each memory cell 320) is a single-level cell (SLC) that has two possible memory states, and thus can store one bit of data. For example, the first memory state "0" of the two possible memory states can correspond to a first range of voltages, and the second memory state "1" of the two possible memory states can correspond to a second range of voltages. In some implementations, the memory cell 320 (e.g., each memory cell 320) is a memory cell that is capable of storing more than a single bit of data in more than four possible memory states; For example, the memory cell 320 (e.g., each memory cell 320) can store two bits per cell (also known as multi-level cell (MLC)), three bits per cell (also known as triple-level cell (TLC)), or four bits per cell (also known as a quad-level cell (QLC)). For example, the memory cell 320 (e.g., each memory cell 320) can be programmed to assume a range of possible nominal storage values. In one example, if the memory cell 320 (e.g., each memory cell 320) stores two bits of data, then the memory cell 320 (e.g., each memory cell 320) can be programmed to assume one of three possible programming levels from an erased state by writing one of three possible nominal storage values to the cell. A fourth nominal storage value can be used for the erased state.

In some implementations, the NAND memory string 326 (e.g., each NAND memory string 326) can also include a select transistor at at least one of its end. For example, as shown in FIG. 3, each NAND memory string 326 include a source select gate (SSG) transistor 322 at its source end and a drain select gate (DSG) transistor 324 at its drain end. For example, the SSG transistor 322 and the DSG transistor 324 can be configured to activate the selected NAND memory strings 326 (columns of the array) during read and program operations. In some implementations, the sources of NAND memory strings 326 in the same block 306 are coupled with each other through a same source line (SL), e.g., a common SL (CSL) 314. In other words, all NAND memory strings 326 in the same block 306 coupled to an array common source (ACS), according to some implementations. The drain of each NAND memory string 326 is coupled to a respective bit line (BL) 316 from which data can be read or written via an output bus (not shown), according to some implementations. In some implementations, each NAND memory string 326 is configured to be selected by applying a DSG select voltage VDSG to the gate of a respective DSG transistor 324 through one or more DSG lines 308 and/or by applying an SSG select voltage VSSG to the gate of a respective SSG transistor 322 through one or more SSG lines 312.

In some implementations, the select transistor can include select transistors connected in series; for example, the SSG transistor include a first select transistor and a second select transistor; the second select transistor is connected to the first select transistor, and is between the first select transistor and the memory cell.

For example, as shown in the FIG. 3 there are two SSG transistors 322 connected in series and located between the CSL 314 and the memory cell 320. The first SSG transistor 322 shown in the FIG. 3 is connected to the CSL 314, while the second SSG transistor 322 is coupled (e.g., directly or indirectly connected) to the memory cell 320. It should be understood that, although in the embodiments as shown in FIG. 3, the select transistor includes only two SSG transistors 322 connected in series, in some other implementations, the select transistor can include more than two SSG transistors connected in series, correspondingly, one or more additional SSG transistors can be formed between the memory cell 320 and the CSL 314; similarly, although in the embodiments as shown in FIG. 3, the select transistor includes only one DSG transistor 324, in some other implementations, the select transistor can include DSG transistors connected in series, correspondingly, one or more additional DSG transistors can be formed between the memory cell 320 and the BL 316.

As shown in FIG. 3, the NAND memory strings 326 can be organized into multiple blocks 306, each block 306 is coupled to a corresponding common source line 314. In some implementations, each block 306 is a basic data unit for erase operations, i.e., all memory cells 320 on the same block 306 can be erased in same one erase operation (e.g., erased at the same time). For example, memory cells 320 that are in same one row and in adjacent NAND memory strings 326 can be coupled to same one word line 310, and thus word lines 310 can be used for selecting which row of memory cells 320 is affected by read and program operations. In some implementations, a page 318, which is the basic data unit for program and read operations, includes memory cells 320 coupled to same one word line 310. For example, the size of one page 318 in bits is relevant to the number of NAND memory strings 326 coupled by same one word line 310 in one block 306. Word line 310 can include a gate line coupled to control gates (gate electrodes) of memory cells 320 belonging to a corresponding page 318.

Descriptions regarding GIDL erase operation (erase phase of the erase operation) and the decline of the threshold voltage of the select transistor are given in the following with reference to FIG. 3. In some implementations, in a GIDL erase operation to erase a selected memory block 306, the common source line 314 coupled to (e.g., directly or indirectly connected to) memory strings 326 in the selected memory block 306 may be applied (e.g., biased) with a positive voltage (e.g., around 20 V), and word lines 310 in the selected memory block 306 may be applied with a voltage (e.g., around 0 V) lower than the positive voltage; for example, word lines 310 in the selected memory block 306 may be connected to the common ground, the common ground provides e.g., a ground (GND) voltage or 0 V. In some implementations, in addition to CSL 314, BLs 316 coupled to memory strings 326 in a selected memory block 306 are also applied (e.g., biased) with a positive voltage (e.g., around 20 V) higher than the voltage applied to the word lines 310. In some other erase operations, only BLs 316 coupled to memory strings 326 in a selected memory block 306 is applied (e.g., biased) with a positive voltage (e.g., around 20 V) higher than the voltage applied to the word lines, that is, the CSL 314 coupled to memory strings 326 in a selected memory block 306 is not applied (e.g., biased) with a positive voltage (e.g., around 20 V) higher than the voltage applied to the word lines. With the configurations aforementioned, holes can be generated, and injected into storage layers of memory cells 320 in the selected memory block 306, and thus electrons in storage layers of memory cells 320 in the selected memory block 306 can be decreased; for example, holes, generated between CSL314 and SSG 322 as well as between BL 316 and DSG 324, can be injected into storage layers of memory cells 320 in the selected memory block 306 according to Fowler-Nordheim Tunneling.

FIG. 4A illustrates a cross-sectional view of an exemplary memory device 400 according to some aspects of the present disclosure.

Figure 4B:
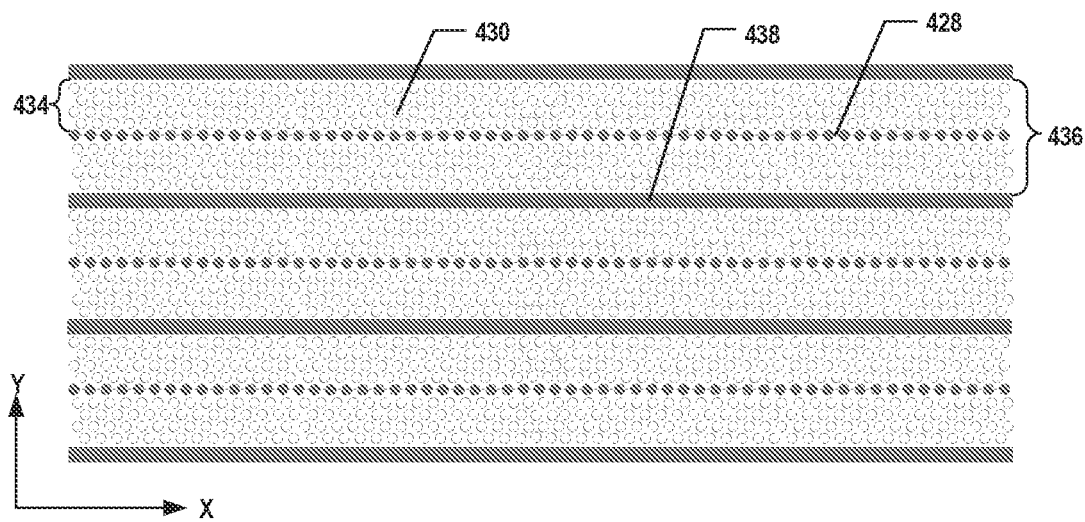

As shown in FIG. 4A, memory device 400 includes a substrate 402 and a 3D NAND memory string 432 (corresponding to NAND memory string 326 in FIG. 1) extending vertically as compared to the substrate 402. For example, the substrate 402 can include silicon (e.g., single crystalline silicon), silicon germanium (SiGe), gallium arsenide (GaAs), germanium (Ge), silicon on insulator (SOI), germanium on insulator (GOI), or any other suitable materials. In one implementation, the substrate 402 includes (e.g., is) a N type doped region which function as an high voltage N type well source during the GIDL erase operation. It is noted that x, y and z axes illustrated in FIGS. 4A and 4B are for illustrating the spatial relationship of the components in memory device 400. Substrate 402 includes two lateral surfaces (e.g., a top surface and a bottom surface) extending laterally in the x-direction (i.e., the lateral direction).

As used herein, whether one component is "on," "above," or "below" another component of a semiconductor structure (e.g., memory device 400) is determined relative to the substrate of the semiconductor structure (e.g., substrate 402) in the y-direction (i.e., the vertical direction or depth direction) when the substrate is positioned in the lowest plane of the semiconductor structure in the y-direction. The same notion for describing the spatial relationship is applied throughout the present disclosure.

As shown in FIG. 4A, 3D NAND memory string 432 (corresponding to memory string 326 in FIG. 3) extends vertically in (e.g., through) a memory stack 404 having interleaved gate conductive layers 406 (also referred to herein as "memory layers") and gate-to-gate dielectric layer 408 above substrate 402. Gate conductive layers 406 and gate-to-gate dielectric layer 408 in memory stack 404 can alternate in the vertical direction. For example, except for the ones at the top or bottom of memory stack 404, each gate conductive layer 406 can be adjoined by two gate-to-gate dielectric layer 408 on both sides, and each gate-to-gate dielectric layer 208 can be adjoined by two gate conductive layers 406 on both sides. The number (e.g., 32, 64, 96, or 128) of the pairs of gate conductive layers 406 and gate-to-gate dielectric layer 408 in memory stack 404 is relevant to the number of memory cells in memory device 400. Each gate conductive layer 406 can include conductive materials including, but not limited to, tungsten (W), cobalt (Co), copper (Cu), aluminum (Al), polysilicon, doped silicon, silicides, or any combination thereof. In some implementations, each gate conductive layer 406 includes a metal layer, such as a tungsten layer. In some implementations, each gate conductive layer 406 includes a doped polysilicon layer. In various implementations of the present disclosure, gate conductive layer 406 can be at any suitable position/level between the drain and the source of the 3D NAND memory string 432.

As shown in FIG. 4A, 3D NAND memory string 432 includes a channel structure 430 extending vertically in (e.g., through) memory stack 404. In some implementations, channel structure 430 includes a channel hole filled with semiconductor material(s) (e.g., as a semiconductor channel 420) and dielectric material(s) (e.g., as a memory film 418). In some implementations, semiconductor channel 420 includes silicon, such as amorphous silicon, polysilicon, or single crystalline silicon. In some implementations, memory film 418 is a composite dielectric layer including a tunneling layer 426, a storage layer 424 (also known as a "charge trap layer/storage layer"), and a blocking layer 422. Channel structure 430 can have, e.g., a cylinder shape (e.g., a pillar shape). Semiconductor channel 420, tunneling layer 426, storage layer 424, blocking layer 422 are, e.g., arranged radially from the center toward the outer surface of the pillar in this order, according to some implementations. Tunneling layer 426 can include silicon oxide, silicon oxynitride, or any combination thereof. Storage layer 424 can, e.g., include silicon nitride, silicon oxynitride, silicon, or any combination thereof. Blocking layer 422 can, e.g., include silicon oxide, silicon oxynitride, high dielectric constant (high-k) dielectrics, or any combination thereof. In one example, memory film 418 can include a composite layer of silicon oxide/silicon oxynitride/silicon oxide (ONO).

In some implementations, gate conductive layers/memory layers 406 can be used as word lines (e.g., word lines 310 in FIG. 3) and select lines (e.g., select lines 308 and 312 in FIG. 3). In some implementations, as shown in FIG. 4A, gate conductive layers/memory layers 406 include control gates 450 surrounding corresponding channel structures 430 of 3D NAND memory string 432.

In some implementations, the memory cells of 3D NAND memory strings 432 include corresponding control gates 450 (each being part of gate conductive layer/memory layer 406) surrounding corresponding channel structures 430. Gate conductive layers 406, which are used as word lines, can receive word line voltages (e.g., word line bias voltages V_WL as shown in FIG. 3) and the word line voltages can be transmitted to corresponding control gates 450 coupled (e.g., connected) to the word lines for performing operations (e.g., by reading, erasing, and programming operations) of the memory cells.

It should be understood that the memory device 400 as shown in FIG. 4A can include other suitable components, which includes, but not limited to, gate line slits/source contacts, local contacts, interconnect layers, etc.

As an example, the memory stack 404 in FIG. 4A is implemented as a single-deck architecture. It should be understood that, in some implementations, the memory stack 404 can be implemented as a multi-deck architecture. e.g., a dual-deck memory stack including a lower memory deck above the substrate 402 and an upper memory deck above the lower memory deck. In the case where the memory stack 404 in FIG. 4A is implemented as a multi-deck architecture, the channel structure 430 of the 3D NAND memory string 432 can be implemented as a single channel structure, and the portion, extending in the lower memory deck, of the channel structure 430 and the portion, extending in the upper memory deck, of the channel structure 430 are formed in a same process.

It should be understood that, in some implementations, in the case where the memory stack is implemented as a multi-deck architecture, the channel structure of the 3D NAND memory string may include two channel structures electrically connected by an inter-deck plug (not shown), and in this case, the portion, extending in the lower memory deck, of the channel structure and the portion, extending in the upper memory deck, of the channel structure are formed in different processes.

FIG. 4B illustrates a plan view of an exemplary memory device according to some aspects of the present disclosure.

As shown in FIG. 4B, NAND memory strings 432 (including corresponding channel structures 430) can be arranged into blocks 436 (e.g., corresponding to block 306 in FIG. 3) by slit structures 438 (e.g., gate line slits (GLSs)), which electrically separate word lines 310 in adjacent blocks 436, such that each block 436 can be individually controlled in read, program, and erase operations. In one example, each slit structure 438 may extend along the x-direction (e.g., the word line direction), and the blocks 436 may be arranged along the y-direction (e.g., the bit line direction). In some implementations, each block 436 can be further divided into smaller areas (e.g., fingers 434) by DSG cuts 428, which electrically separate DSG lines 310 in adjacent fingers 434, such that DSG lines 310 in different fingers 434 can be individually controlled in read and program operations.

Referring back to FIG. 3, peripheral circuits 302 can be coupled to memory cell array 304 through, e.g., bit lines 316, word lines 310, source lines 314, SSG lines 312, and DSG lines 310. Peripheral circuits 302 can include any suitable analog, digital, and mixed-signal circuits for facilitating the operations of memory cell array 304 by applying and sensing voltage signals and/or current signals to and from each target (select) memory cell 320 through bit lines 316, word lines 310, source lines 314, SSG lines 312, and DSG lines 310. For example, peripheral circuits 302 can include various types of peripheral circuits formed using metal-oxide-semiconductor (MOS) technologies.

Figure 5:
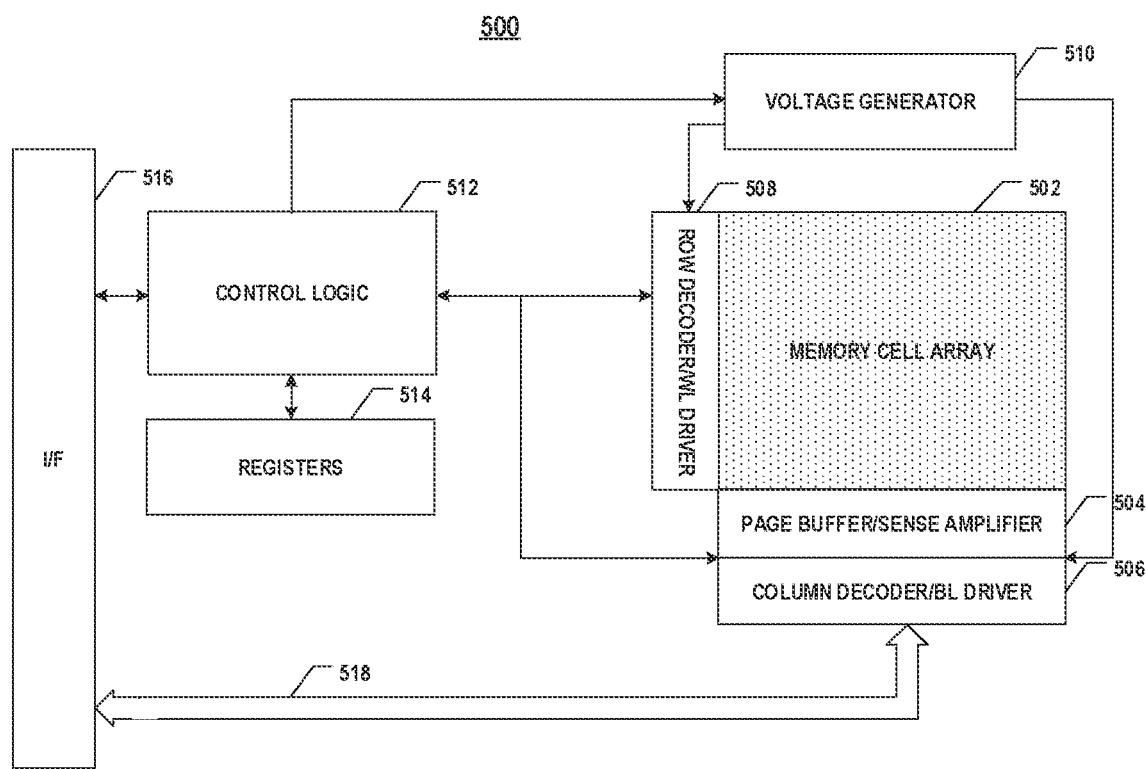
FIG. 5 illustrates a block diagram of a memory device including a memory cell array and peripheral circuits, according to some aspects of the present disclosure.

FIG. 5 illustrates a block diagram of a memory device including a memory cell array and peripheral circuits, according to some aspects of the present disclosure. For example, the memory device 500 as shown in FIG. 5 illustrates some exemplary peripheral circuits including a page buffer/sense amplifier 504, a column decoder/bit line driver 506, a row decoder/word line driver 508, a voltage generator 510, and a control logic 512. It should be understood that in some examples, additional peripheral circuits not shown in FIG. 5 may be included as well. As shown in FIG. 5, the memory device 500 further includes a memory cell array 502, registers 514, an interface 516, and a data bus 518.

Page buffer/sense amplifier 504 can be configured to read and program (write) data from and to memory cell array 502 (corresponding to memory cell array 304 as shown in FIG. 3) according to control signals from control logic 512. In one example, page buffer 504 may store one page of program data (write data) into one page (e.g., page 318 as shown in FIG. 3) of memory cell array 502. In another example, page buffer/sense amplifier 504 may perform program verify operations to ensure that the data has been properly programmed into a selected memory cell (e.g., memory cell 320 as shown in FIG. 3) coupled to selected word lines (e.g., word lines 310 as shown in FIG. 3). In still another example, sense amplifier 504 may sense low power signals, that represents a data bit stored in a selected memory cell (e.g., memory cell 320 as shown in FIG. 3), via a corresponding bit line (e.g., bit line 316 as shown in FIG. 3), and amplify the small voltage swing to recognizable logic levels in a read operation.

Column decoder/bit line driver 506 can be configured to be controlled by control logic 512 and select one or more NAND memory strings (e.g., NAND memory strings 326 as shown in FIG. 3) by allowing voltages generated by voltage generator 510 to be applied to corresponding select lines.

Row decoder/word line driver 508 can be configured to be controlled according to control signals from control logic 512, and further can be configured to select/unselect blocks (e.g., blocks 306 as shown in FIG. 3) of memory cell array 502, and word lines (e.g., word lines 310 as shown in FIG. 3) coupled to blocks. Row decoder/word line driver 508 can be further configured to drive word lines 310 by using word line voltages from voltage generator 510. In some implementations, row decoder/word line driver 508 can select/deselect SSG lines and DSG lines (e.g., SSG lines 312 and DSG lines 310 as shown in FIG. 3) by using corresponding SSG voltages and DSG voltages from voltage generator 510.

Voltage generator 510 can be configured to be controlled by control logic 512 and generate word line voltages (e.g., read voltage, program voltage, pass voltage, verification voltage), SSG voltages (e.g., select/unselect voltages), DSG voltages (e.g., select/unselect voltages), bit line voltages (e.g., ground voltage), and source line voltages (e.g., ground voltage) to be supplied to memory cell array 502 (corresponding to memory cell array 304), as described below in detail.

Control logic 512 can be coupled to peripheral circuits (e.g., each peripheral circuit) described above and configured to control operations of peripheral circuits (e.g., each peripheral circuit).

In some implementations, registers 514 can be coupled to control logic 512 and include status registers, command registers, and address registers for storing status information, command operation codes (OP codes), and command addresses for controlling the operations of each peripheral circuit.

In some implementations, control logic 512 can receive an erase command issued by a memory controller (e.g., memory controller 106 in FIG. 1) and send control signals to various peripheral circuits, such as row decoder/word line driver 508, column decoder/bit line driver 506, and voltage generator 510 to initiate the erase operation on a selected block (e.g., block 306 as shown in FIG. 3) of memory cell array 502.

In some implementations, in response to receiving an erase command issued by the memory controller, control logic 512 can send control signals to at least row decoder/word line driver 508, such that a first voltage V1 can be applied to the select line and a second voltage V2 can be applied to the CSL while the first voltage V1 is applied to the select line. The control logic 512 can also send control signals to the column decoder/bit line driver 506 to allow a second voltage V2 to be applied to the BL while the first voltage V1 is applied to the select line. For example, the first voltage V1 can be applied to both of the DSG line and the SSG line (e.g., the DSG line 308 and the SSG line 312 in FIG. 3). In some implementations, a first peak level of the first voltage V1 is greater than a second peak level of second voltage V2. For example, by allowing the peripheral circuits to apply the first voltage V1 and the second voltage V2, and allowing the first peak level of the first voltage V1 to be greater than the second peak level of second voltage V2, the threshold voltage of the DSG transistor 324 and/or SSG transistor 322 can be adjusted (e.g., increased) to a predetermined level. It should be understood that, embodiments of the present disclosure are not limited to the case where the first voltage V1 and the second voltage V2 are applied in response to receiving an erase command, and the first voltage V1 and the second voltage V2 can be applied respectively to the select line and the CSL in response to receiving any other suitable command.

In some implementations, interface 516 can be coupled to control logic 512, and interface 516 can act as a control buffer to buffer and relay control commands received from a memory controller (e.g., memory controller 106 in FIG. 1) to control logic 512, and to buffer and relay status information received from control logic 512 to the memory controller. In some implementations, interface 516 can also be coupled to column decoder/bit line driver 506 via data bus 518 and act as a data input/output (I/O) interface and a data buffer to buffer and relay the data to and from memory cell array 304.

In some implementations, the peripheral circuit is configured to: generate a first signal carrying a first voltage to be applied to the select line; and generate a second signal carrying a second voltage to be applied to the SL and/or the BL, in which a first peak level of the first voltage is greater than a second peak level of second voltage. In some implementations, the peripheral circuit is configured to: apply a first voltage to the select line, apply a second voltage to the SL and/or the BL. In some implementations, the first signal is generated before an erase phase of an erase operation of the memory string.

In some implementations, the peripheral circuit is further configured to: generate a third signal carrying a third voltage to be applied to the word line. In some implementations, the peripheral circuit is configured to: apply the third voltage to the word line.

FIG. 6A illustrates an exemplary schematic diagram of a memory string of a memory device 600. Memory device 600 may be, e.g., a 3D NAND memory device. As shown in the FIG. 6B, memory device 600 may include a memory stack 608 (e.g., corresponding to memory stack 404 as shown in FIG. 4A), and the memory stack 608 may include word lines, a DSG line (e.g., corresponding to DSG line 308 as shown in FIG. 3) and an SSG line (e.g., corresponding to SSG Line 312 as shown in the FIG. 3), and the DSG line and the SSG line are respectively on the top portion (e.g., topmost portion) and bottom portion (e.g., bottommost portion) of memory stack 608.

Figure 6B:
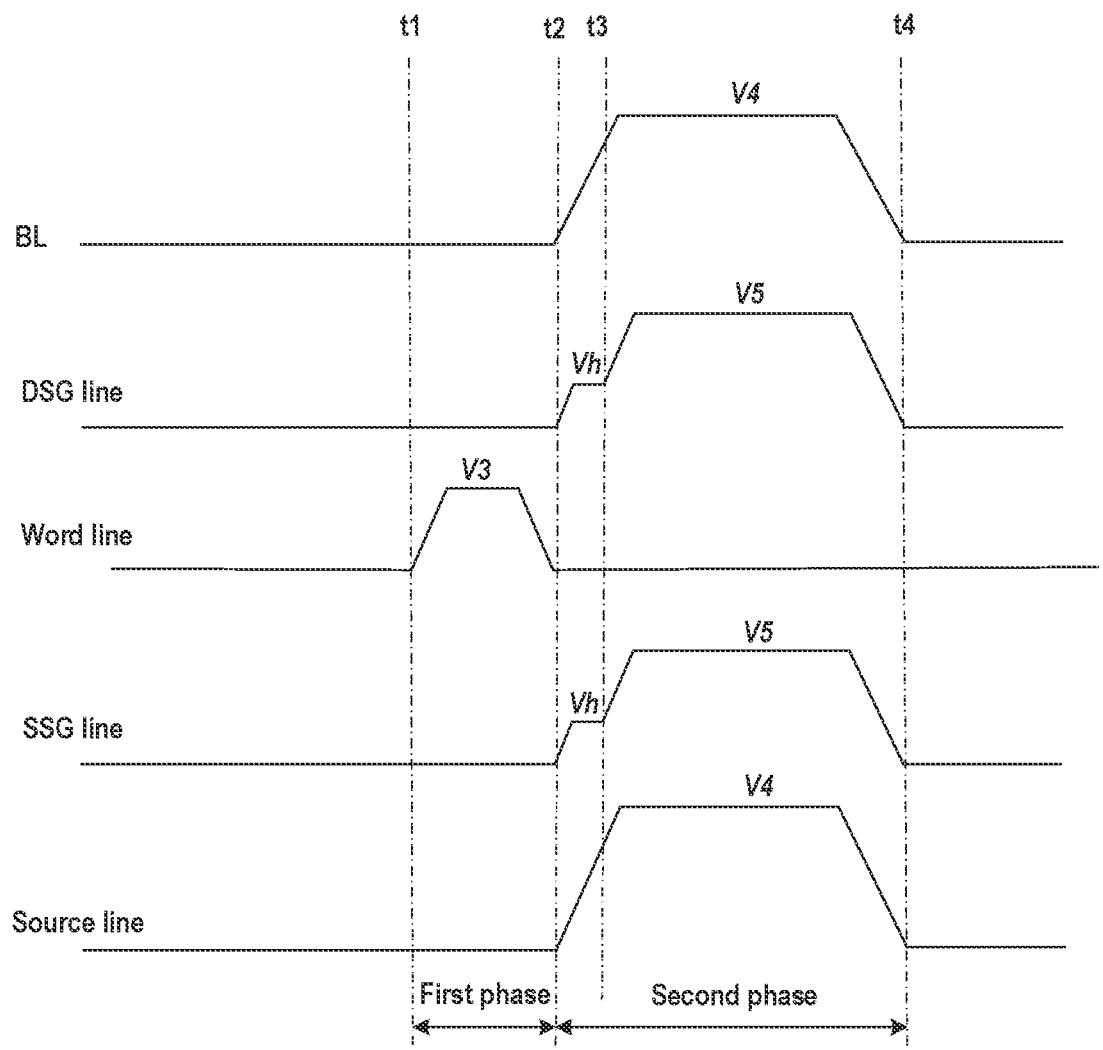
FIG. 6B illustrates an exemplary timing diagram for driving the memory string of the memory device as shown in the FIG. 6A during an erase operation.

FIG. 6B illustrates an exemplary timing diagram for driving the memory device 600 as shown in the FIG. 6A during an erase operation. As shown in the FIG. 6A, memory device 600 may further include semiconductor channels 610, a bit line 612 and a source line 602. Semiconductor channels 610 of 3D NAND memory string (e.g., corresponding to memory string 328 as shown in FIG. 3) may be coupled (e.g., conductively connected directly or indirectly) to the bit line 612 and the source line 602.

As shown in the FIG. 6B, the erase operation can include two phase, which include a first phase and a second phase, the first phase is a pre-program phase, and is during the time period between the time point t1 and time point t2, the second phase is an erase phase, and is during the time period between the time point t2 and time point t4.

As shown in the FIG. 6B, during the pre-program phase, a positive voltage V3 is applied to the word line coupled to memory cell during the time period between time point t1 and time point t2, the voltage applied to the bit line 612, the voltage applied to the source line 602, the voltage applied to the SSG line as well as the voltage applied to the DSG line are kept at a voltage level or a voltage range (e.g., around 5V) that is lower than the positive voltage V3, e.g., during the time period between time point t1 and time point t2. For example, the voltage applied to the SSG line as well as the voltage applied to the DSG line are kept at a voltage level (e.g., an unselect voltage level) or a voltage range that turns on the SSG transistor and the DSG transistor. In some implementations, the bit line 612 and the source line 602 are grounded between time point t1 and time point t2, such that the sources and the drains of memory strings (e.g., each memory string) are grounded; the SSG line and the DSG line are both grounded between time point t1 and time point t2 to keep the SSG transistor and the DSG transistor turning off.

In some other implementations, the positive voltage V3 can be a pre-program voltage Vpgm which is higher than a pass voltage Vpass; for example, the pre-program voltage Vpgm can allow the memory cell to be turned on and to be programed during the pre-program phase; for example, during read operations, pass voltages Vpass are applied to unselected memory cells in a selected memory string, to allow the unselected memory cells to be turned on.

In some other implementations, during the erase phase (e.g., during the time period between the time point t2 and t4), column decoder/bit line driver 506 may apply a positive bit-line voltage to the bit line 612 connected to 3D NAND memory string, row decoder/word line driver 508 applies a word line voltage V_WL (e.g., a voltage around 0V or a GND voltage) to the word line. In some implementations, a positive source-line voltage may be applied to the source line 602. The bit-line voltage and the source-line voltage are collectively referred to as a positive voltage V4, as shown in the FIG. 6B. In some implementations, the positive voltage V4 (e.g., the fourth peak level of the positive voltage V4) may be larger than the word line voltage V_WL and may range from 18V to 25V, such as 19 V, 20 V, 21 V, 22 V, 23 V, 24 V, and 25 V. For example, the voltage difference between the positive voltage V4 (e.g., the fourth peak level of the positive voltage V4) and the word line voltage V_WL (e.g., the peak level of the word line voltage V_WL) may range from 18V to 25V. In an example, the bit-line voltage and the source-line voltage (e.g., the peak level of the bit-line voltage and the source-line voltage) are each 20 V. According to some implementations, during the time period between t2 and t4, row decoder/word line driver 508 applies a 0 V-voltage (i.e., GND voltage), e.g., V_WL, to word line.

In some implementations, during the time period between t2 and t3, row decoder/word line driver 508 may apply a suitable voltage (e.g., Vh) on DSG line and then release (e.g., the voltage Vh is not applied to the DSG line by the row decoder/word line driver 508 during the time period between t3 and t4 anymore), the DSG line is in a floating state during the time period between t3 and t4, and thus the potential on the DSG line can be coupled to a voltage level V5 due to the coupling effect, e.g., between the DSG line and the BL. In the case where the voltage Vh is applied on the DSG line during the time period between t2 and t3, the voltage V5 (e.g., the fifth peak level of the fifth voltage V5) is less than the positive voltage V4 (e.g., the fourth peak level of the positive voltage V4) applied to the BL and/or the source line. In some implementations, same or similar operation can be implemented to the SSG line as shown in the FIG. 6B at the beginning of the second phase (e.g., during the time period between t2 and t3), row decoder/word line driver 508 may apply a suitable voltage (e.g., Vh) to SSG line and then release (e.g., the voltage Vh is not applied to the SSG line by the row decoder/word line driver 508 during the time period between t3 and t4 anymore), the SSG line is in a floating state during the time period between t3 and t4, and thus the potential on the SSG line is coupled to a voltage level V5 due to the coupling effect, e.g., between the SSG line and the CSL. In the case where the voltage Vh is applied on the SSG line during the time period between t2 and t3, the voltage V5 (e.g., the fifth peak level of the fifth voltage V5) is less than the positive voltage V4 (e.g., the fourth peak level of the positive voltage V4) applied to the CSL. In some implementations, the voltage Vh applied to the DSG line and the SSG line are each equal to 0 V (i.e., GND voltage). In some other implementations, the voltages Vh (e.g., the peak level of the voltage Vh) applied to the DSG line and the SSG line are each equal to a positive value that is lower than V4, the voltage Vh may be about 2 V.

The erase operation in embodiments of the present disclosure can be implemented as GIDL erase operation and the GIDL erase operation can, e.g., improve the erase uniformity and efficiency. In some implementations of GIDL erase operation, BTBT current, can be generated during the erase phase (e.g., during the time period between t2 and t4) at, e.g., the PN junctions in the upper and lower portions of semiconductor channel 610, and the PN junctions can be, e.g., between DSG line and the doped (e.g., N-doped) regions of 3D NAND memory string, as well as between the SSG line and the doped (e.g., N-doped) regions of 3D NAND memory string. As shown in the FIG. 6A, holes 604 can be generated, e.g., between the source line and SSG Line, as well as between the DSG line and bit line, and the holes 604 can move from the lower and upper portions of semiconductor channel 610 towards the middle portion of semiconductor channel 610. In some implementations, holes move from the upper and lower ends, passing through portions of semiconductor channel 610 that are electrically connected to DSG line and SSG line, towards the portion of semiconductor channel between DSG line and SSG line. Similarly, holes 804 can be generated during erase phase in the memory device 800 as shown in the FIG. 8A, and holes 904 can be generated during erase phase in the memory device 900 as shown in the FIG. 9A.

For example, inventors of the present disclosure have noted during research that, the timing diagram as shown in FIG. 6B and similar timing diagrams can cause Vt of the select transistor shift down and/or can lower the efficiency of erase operation of the memory device, and details are given in the following with reference to FIG. 6C and FIG. 6D.

Figure 6C:
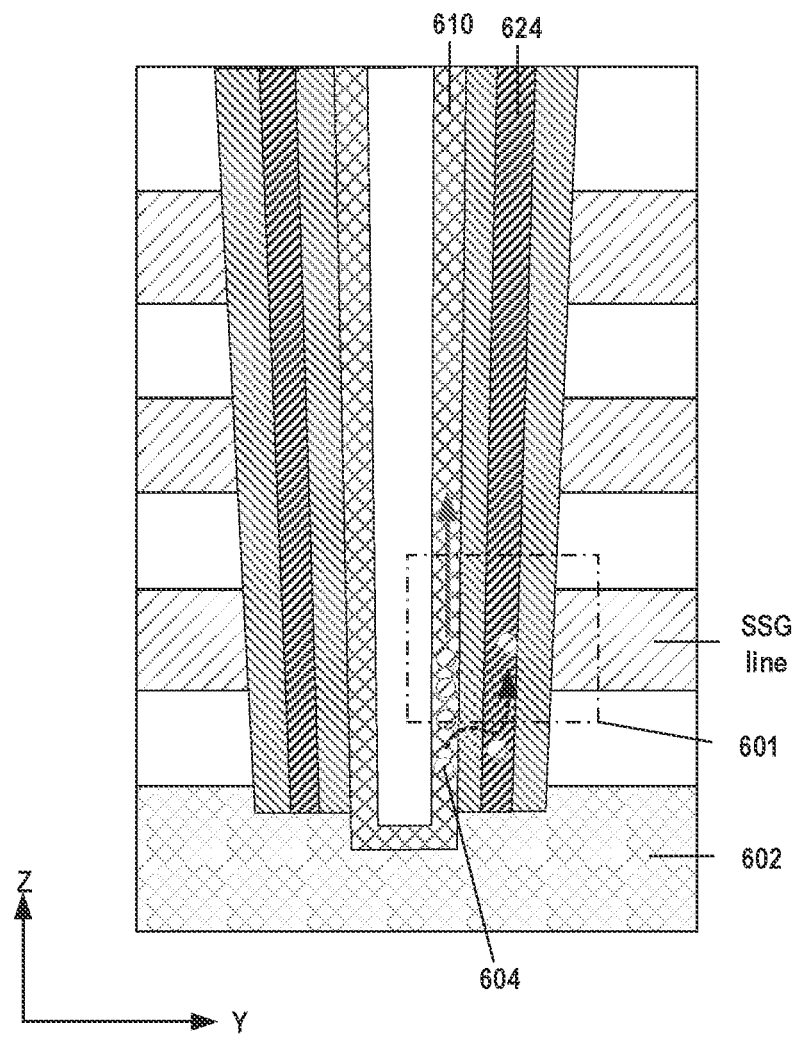
FIG. 6C illustrates another exemplary schematic diagram of the memory string of the memory device as shown in FIG. 6A, according to some aspects of the present disclosure.
Figure 6D:
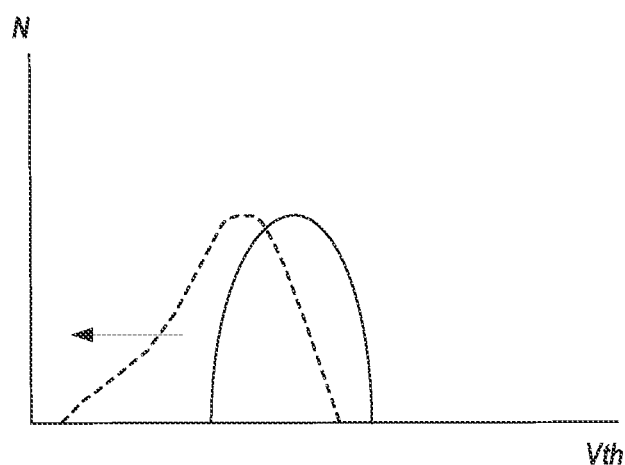
FIG. 6D illustrates a threshold voltage changing of a select transistor of the memory string of the memory device as shown in FIG. 6A after performing the erase operation illustrated in the FIG. 6B.

FIG. 6C illustrates another exemplary schematic diagram of a memory string of memory device 600, and FIG. 6D illustrates a threshold voltage changing of a select transistor 601 of a memory string of the memory device 600. As shown in the FIG. 6C, in case where the timing diagram as shown in FIG. 6B or similar timing diagram is adopted to drive the memory device 600 as shown in FIG. 6A or FIG. 6C, band to band tunneling presents and holes 604 tunneling into the storage layer 624 of the select transistor 601 during an erase phase. As shown in FIG. 6C, during the erase phase, holes 604 can gain energy and tunneling into the storage layer 624 of the select transistor 601 of the memory device 600 (e.g., 3D NAND) memory devices, the extra holes tunneled into the storage layer 624 of the select transistor 601 (e.g., a SSG transistor coupled to a SSG line) can decrease the threshold voltage (Vt) of the select transistor 601 (e.g., SSG transistor) as shown in the FIG. 6C, and thus, after many times of erase operation, as shown in the FIG. 6D, the threshold voltage Vt of the select transistor 601 (e.g., SSG transistor) can shift down (e.g., shift from the Vt distribution represented by a solid line towards the Vt distribution represented by a dash line towards), and/or the efficiency of GIDL erase can be lowered. For example, the threshold distribution of the select transistor can be changed to an undesired level or range. It should be understood that, FIG. 6C is merely an example of the situation that may result in the Vt shift down of the SSG during the erase operation, while the Vt shift down of the select transistor can also happened in many other situations. It should be understood that, in some implementations, the Vt of the DSG transistor can shift down during erase operations, and the efficiency of GIDL erase can be adversely affected by Vt shifting of the DSG transistor.

Inventors of the present disclosure have noted during research that, by applying a first voltage to the select line, applying a second voltage to the CSL and/or the BL, and allowing a first peak level of the first voltage to be greater than a second peak level of second voltage, the threshold voltage Vt of the select transistor can be increased. Exemplary descriptions are given in the following with reference to embodiments as shown in FIG. 7A-FIG. 10.

Figure 7A:
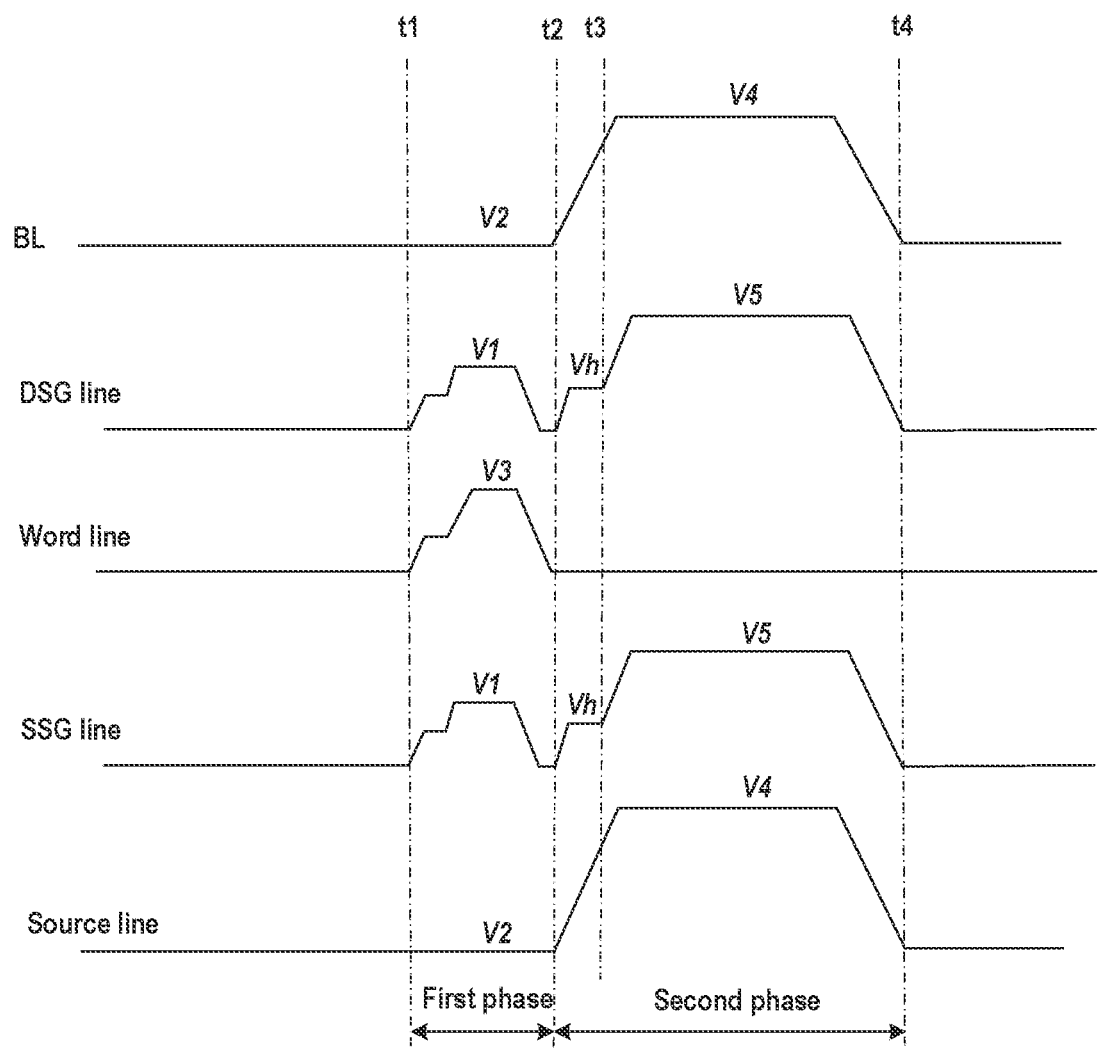
FIG. 7A illustrates an exemplary waveform diagram for driving the memory device as shown in the FIG. 6A during an erase operation, according to some aspects of the present disclosure.

FIG. 7A illustrates an exemplary timing diagram or waveform diagram for driving the 3D NAND memory device 600 as shown in the FIG. 6A during an erase operation. In some implementations, similar to FIG. 6B, the erase operation as shown in the FIG. 7A also includes (e.g., is also divided into) two phases, which include a first phase and a second phase.

In some implementation, the second phase is an erase phase, and the first phase is before the second phase. For example, the second phase is immediately after the first phase; for example, no operation (e.g., read operation, erase operation, or program operation) is performed between the first phase and the second phase; for example, no other phase (e.g., a phase for realizing a pre-determined function) is between the first phase and the second phase. In some implementation, other phase may present between the first phase and the second phase. For example, each erase operation can include the first phase; for another example, only some of erase operations can include the first phase.

As shown in the FIG. 7A, during the first phase (e.g., pre-program phase) during the time period between t1 and t2, a first voltage V1 can be applied to the select line (e.g., DSG line and SSG line) by, e.g., a row decoder/word line driver, and a second voltage V2 can be applied to the BL 612 and source line 602 by, e.g., a column decoder/bit line driver. The first voltage has a first peak level that is greater than a second peak level of second voltage which is applied to the BL 612 and source line 602. For example, holes or electrons can tunneling from the semiconductor channel 610 into the storage layer of the select transistor, and thus the threshold voltage Vt of the select transistor can be programmed to a desired level or range. The first voltage V1 can adopt any suitable values to enable the threshold voltage Vt of the select transistor to change (e.g., to increase). In some implementation, the first voltage V1 (e.g., the first peak level of the first voltage) can be a voltage (e.g., a pre-program voltage Vpgm) which is greater than the pass voltage Vpass that can turn on the select transistor. The Vpgm can program the select transistor and result in the threshold voltage Vt of the select transistor shifting up.

In some other implementations, the voltage V1 (e.g., the first peak level of the first voltage) applied to the select line can range from 12V to 15V, such as 12.5 V, 13V, 14V, and 14.5 V. In an example, the voltages V1 (e.g., the first peak level of the first voltages) applied to the SSG line and DSG line are each around 14.5 V. In some implementation, the second voltage V2 (e.g., the second peak level of second voltage) can range from −1V to 2V. In an example, the second voltage can be a ground voltage. In some implementation, the difference between the voltage V1 (e.g., the first peak level of the first voltage) and the second voltage V2 (e.g., the second peak level of second voltage) can range from 10V to 16V (e.g., 12V to 15V). In an example, the difference between the voltage V1 (e.g., the first peak level of the first voltage) and the second voltage V2 (e.g., the second peak level of second voltage) can be equal to 13V.

As shown in the FIG. 7A, the first voltage V1 is applied to both the DSG line and the SSG line, and the second voltage V2 is applied to both the BL and CSL, and thus, in the case as illustrated in FIG. 7A, both the DSG transistor and the SSG transistor can be programed, and both the Vt of the DSG transistor and the Vt of the SSG transistor can be adjusted (e.g., increased) to a predetermined level or range. In some implementation, the first voltage V1 applied to the DSG line is substantially the same as the first voltage V1 applied to the SSG line.

It should be understood that embodiments of the present disclosure are not limited to the case as illustrated in FIG. 7A (the case where the first voltage V1 is applied to both the SSG line and the DSG line during the first phase). In some implementations, the first voltage V1 is applied to the SSG line and not applied to the DSG line (e.g., the voltage applied to the DSG line during the first phase can refer to the embodiments as illustrated in FIG. 6B), and the second voltage V2 is applied to the source line, and thus the SSG transistor can be programed, the Vt of the SSG transistor can be adjusted (e.g., increased) to a predetermined level or range, while, e.g., the Vt of the DSG transistor is substantially unchanged. In some another implementations, the first voltage V1 is applied to the DSG line and not applied to the SSG line (e.g., the voltage applied to the SSG line during the first phase can refer to the embodiments as illustrated in FIG. 6B), and the second voltage V2 is applied to the BL, thus the DSG transistor can be programed, and the Vt of the DSG transistor can be adjusted (e.g., increased) to a predetermined level or range, while, e.g., the Vt of the SSG transistor is substantially unchanged.

In some implementation, during the first phase, the row decoder/word line driver 508 applies a third voltage V3 on a word line. The third voltage has a third peak level that is greater than a second peak level of the second voltage. For example, the third voltage V3 can be a voltage (e.g., pre-program voltage Vpgm) which is greater than the pass voltage Vpass. For example, the pass voltage Vpass can turn on the memory cell. For example, by allowing the third voltage V3 to be the voltage (e.g., pre-program voltage Vpgm) which is greater than the pass voltage Vpass, the memory cell coupled to the word line can be pre-programed before the second phase (erase phase), and in this implementation, the first phase can be referred to as a pre-program phase.

In some implementation, the third voltage V3 that is applied to the word line has a third peak level that is greater than a first peak level of the first voltage which applied to the select line. For example, by allowing the third peak level of the third voltage to be greater than the first peak level of the first voltage applied to the select line, the possibility of over program of the select transistor can be reduced while, e.g., the memory cell coupled to the word line is allowed to be properly pre-programed.

In some implementations, as shown in the FIG. 7A, the first voltage V1 and the third voltage V3 can firstly increase to Vpass, and then increase to corresponding peak levels. In other implementations, the first voltage V1 and the third voltage V3 can directly increase to corresponding peak levels.

In some implementations, the row decoder/word line driver 508 can first hold the voltage applied to the select line to a certain level and then ramp up it to a peak level which is lower than the third peak level of the third voltage V3. For example, the decoder/word line driver 508 can first ramp up the voltage of V1 applied to the SSG line to a level same as Vpass, and hold it to Vpass for a predetermined time, and then ramp up it to a peak level. The decoder/word line driver 508 can also first ramp up the voltage of V1 applied to the DSG line to Vpass, and hold it to Vpass for a predetermined time, and then ramp up it to a peak level. The voltage V3 applied to the Word line can be directly ramp up to a peak level that is greater than the first peak level of the first voltage V1.

In some implementation, the first voltage V1 and the third voltage V3 can be overlapped in time, such that the time period for adjusting (e.g., correcting) the threshold voltage Vt of the select transistor and the time period for performing pre-program on the memory cell can be overlapped, and thus the deterioration degree of the time duration of the erase operation can be reduced. For example, the time period for adjusting (e.g., correcting) the threshold voltage Vt of the select transistor can be within the time period for performing pre-program on the memory cell, such that the time duration of the erase operation is not prolonged and the time duration of the erase operation is not deteriorated.

In some implementation, the first voltage V1 and the third voltage V3 can from same one voltage source. For example, by allowing the first voltage V1 and the third voltage V3 to be from same one voltage source, no extra voltage source is required to provide the first voltage V1 to the select line.

In some implementation, both the first voltage V1 and the third voltage V3 can be ramp pulses and the pulse widths (or ramp up durations) of the first voltage V1 and the third voltage V3 can be controlled separately, such that the third peak level of the third voltage and the first peak level of the first voltage can be controlled separately.

For example, the ramp up duration of the first voltage can be the time duration between the time point that the first voltage begins to ramp up and the time point that the first voltage increases to the first peak level. For example, the ramp up duration of the first voltage can be the time duration between the time point that the first voltage increases to Vpass and the time point that the first voltage increases to the first peak level. For example, the ramp up durations of other voltages can have same or similar meanings.

Figure 7B:
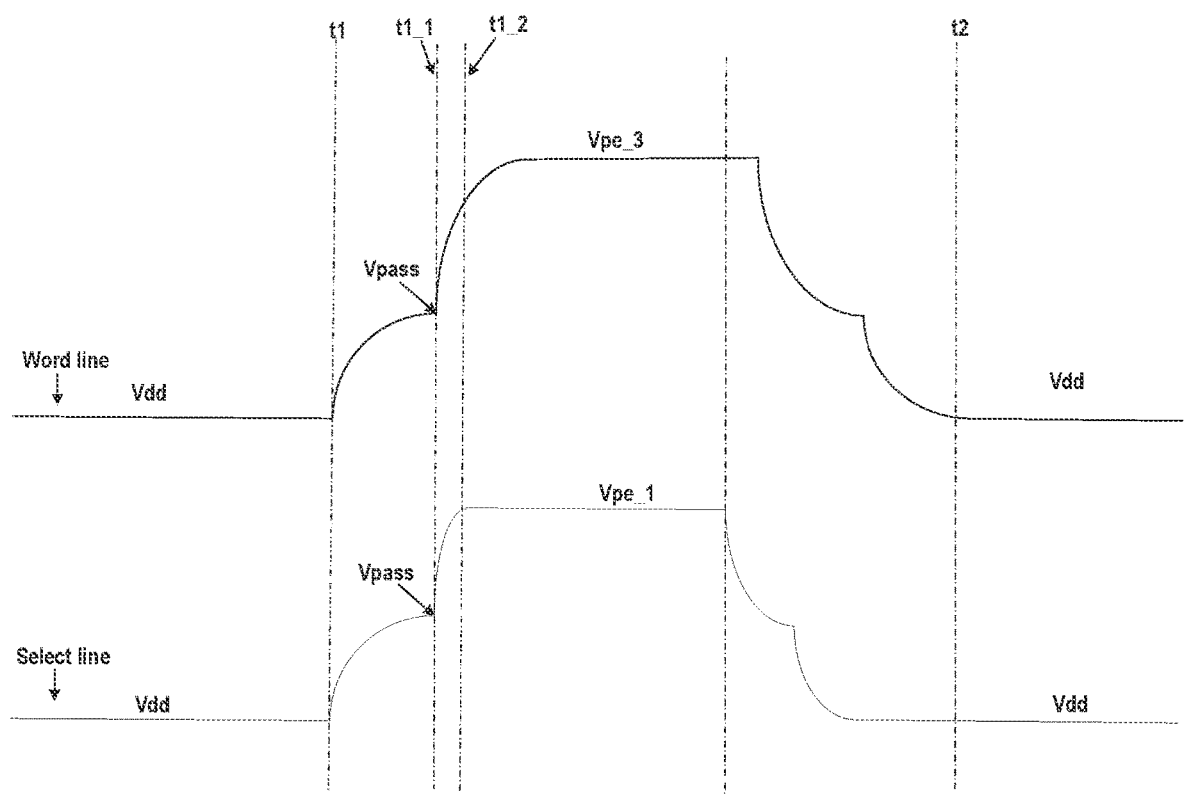
FIG. 7B illustrates exemplary voltage pulses applied to a word line and a select line of a memory device during a pre-program phase in the erase operation illustrated in the FIG. 7A.

FIG. 7B illustrates exemplary voltage pulses applied to the word line and the select line. As shown in the FIG. 7B, a ramp up duration of the third voltage is greater than a ramp up duration of the first voltage. For example, by allowing the ramp up duration of the third voltage to be greater than the ramp up duration of the first voltage, the third peak level of the third voltage coupled to the word line can be greater than the first peak level of the first voltage coupled to the select line, such that the possibility of over program of the select transistor can be reduced while the memory cell coupled to the word line is allowed to be properly pre-programed.

Embodiments of the present disclosure are detailed described in the following with reference to FIG. 7B. For example, as shown in the FIG. 7B, the row decoder/word line driver 508 apply voltages that are from a same voltage source and generated by a voltage generator (e.g., the voltage generator 510 in FIG. 5), to the select line and the word line.

For example, as shown in the FIG. 7B, at time point t1, the voltage outputted from the same voltage source is the voltage Vdd, and begins to ramp up; at time point t1_1, the voltage outputted from the same voltage source are ramped up to the voltage Vpass; correspondingly, the voltages V1 and V3 are ramped up along with the voltage outputted from the same voltage source, from the voltage Vdd at t1 to the voltage Vpass at t1_1, the voltage Vpass can, e.g., allow the select transistor and the memory cell to be turned on. During the time period between the time point t1_1 and time point t1_2, the voltage outputted from the same voltage source continue to ramp up, and thus both of the voltage V1 applied to the select line and the voltage V3 applied to the word line ramp up along with the voltage outputted from the same voltage source (e.g., the voltage V1 and the voltage V3 ramp up synchronously). At the time point t1_2, the decoder/word line driver 508 disconnects the select line from the same voltage source while keeping the electrical connection between the word line and the same voltage source. Thus, the voltage V1 ramped up to the first peak level of the first voltage V1 (Vpe_1) at the time point t1_2. During the time period between time point t1_2 and time point t1_3, the voltage outputted from the same voltage source continue to ramp up, and is still applied to the word line, and thus the voltage V3 continue to ramp up and is ramped up to the third peak level of the third voltage V3 (Vpe_3) which is greater than the first peak level of the first voltage V1 (Vpe_1).

As can be seen in the FIG. 7A and FIG. 7B, the first voltage V1 and the third voltage V3 start to be applied to the select line and word line at time point t1, and the first voltage V1 ramps down before the third voltage V3 starts to ramp down, and thus, the Vt shift of the select transistor can be adjusted (e.g., corrected) during the time period for performing the pre-program of the memory cell coupled to the word line, such that the time duration of the erase operation is not prolonged and the time duration of the erase operation is not deteriorated.

Although the first voltage V1 and the third voltage V3 are overlapped in time as shown in the FIGS. 7A and 7B, it should be understood that the first voltage V1 and the third voltage V3 can also be separately applied to the select line and word line at different time periods, for example, the time period for applying the first voltage V1 (e.g., correcting the threshold voltage Vt of the select transistor) and the time period for applying the third voltage V3 (e.g., performing pre-program) are not overlapped in time; in this case, a pre-program phase can be added, and the pre-program phase can be before the first phase, or between the first phase and the second phase.

It should be understood that, embodiments of the present disclosure are not limited to the case where the first voltage is applied is before the second phase (the erase phase), for example, the first voltage can be applied after the second phase (the erase phase), e.g., at the end of an erase operation; for another example, the first voltage can be applied during any suitable time periods not performed with a read operation, a program operation or an erase operation.

Before enter into the erase phase during the time period between the time point t2 and t4 as shown in the FIG. 7A, the peripheral circuit (e.g., the row decoder/word line driver 508 in FIG. 5) may discharge the first voltage V1, for example, discharge the first voltage V1 to a grounding level (e.g., GND voltage). During the erase phase, the peripheral circuit (e.g., column decoder/bit line driver 506 in FIG. 5) may apply a positive bit-line voltage to the bit line (e.g., the bit line 612 in FIG. 6A) connected to 3D NAND memory string, the peripheral circuit (e.g., the row decoder/word line driver 508 in FIG. 5) applies a word line voltage V_WL (0 V-voltage, i.e., GND voltage) to the word line (e.g., the word line 310 in FIG. 3). In some implementations, a positive source-line voltage may be applied to the CSL (e.g., the CSL 602 in FIG. 6A). The bit-line voltage and the source-line voltage are collectively referred to as a positive voltage V4 as shown in the FIG. 6B. In some implementations, the positive voltage V4 (e.g., the fourth peak level of the positive voltage V4) may be larger than the word line voltage V_WL and may range from 18V to 25V, such as 19 V, 20 V, 21 V, 22 V, 23 V, 24 V, and 25 V. For example, the voltage difference between the positive voltage V4 (e.g., the fourth peak level of the positive voltage V4) and the word line voltage V_WL (e.g., the peak level of the word line voltage V_WL) may range from 18V to 25V. In an example, the bit-line voltage and the source-line voltage (e.g., the peak level of the bit-line voltage and the source-line voltage) are each 20 V. According to some implementations, during the time period between t2 and t4, row decoder/word line driver 508 applies a 0 V-voltage (i.e., GND voltage), e.g., V_WL, to word line.

In some implementations, during the time period between t2 and t3, the peripheral circuit (e.g., row decoder/word line driver 508 in FIG. 5) may apply a suitable voltage (e.g., Vh) on DSG line and then release (e.g., the voltage Vh is not applied to the DSG line from the peripheral circuit during the time period between t3 and t4 anymore), the DSG line is in a floating state during the time period between t3 and t4, and thus the potential on the DSG line can be coupled to a voltage level V5 due to the coupling effect, e.g., between the DSG line and the BL. In the case where the voltage Vh is applied on the DSG line during the time period between t2 and t3, the voltage V5 (e.g., the fifth peak level of the fifth voltage V5) is less than the positive voltage V4 (e.g., the fourth peak level of the voltage V4) applied to the BL and/or the source line. In some implementations, same or similar operation can be implemented to the SSG line as shown in the FIG. 6B at the beginning of the second phase (e.g., during the time period between the time point t2 and t3), the peripheral circuit (e.g., row decoder/word line driver 508 in FIG. 5) may apply a suitable voltage (e.g., Vh) to SSG line and then release (e.g., the voltage Vh is not applied to the SSG line from the peripheral circuit during the time period between t3 and t4 anymore), the SSG line is in a floating state during the time period between t3 and t4, and thus the potential on the SSG line is coupled to a voltage level V5 due to the coupling effect, e.g., between the SSG line and the CSL, the voltage V5 (e.g., the fifth peak level of the fifth voltage V5) is less than the positive voltage V4 (e.g., the fourth peak level of the voltage V4) applied to the CSL. In some implementations, the voltage Vh applied to the DSG line and the SSG line are each equal to 0 V (i.e., GND voltage). In some other implementations, the voltages Vh (e.g., the peak level of the voltage Vh) applied to the DSG line and the SSG line are each equal to a positive value that is lower than V4, the voltage Vh may be about 2 V.

In some implementations, the peripheral circuit is configured to: discharge the first voltage on the select line; generate a fourth signal carrying a positive voltage to be applied to the SL/BL after discharging the first voltage on the select line; and generate a word line signal carrying a voltage, that is smaller than the positive voltage, to be applied to the word line, and the word line signal is applied to the word line while applying the fourth signal.

It should be understood that embodiments of the present disclosure are not limited to the case where the select transistor includes only one SSG transistor and only one DSG transistor. In some implementation, there are more than one select transistor located between the memory cell and the CSL. For example, there can be a first SSG transistor and a second SSG transistor, the second SSG transistor is connected to the first SSG transistor (e.g., the first SSG transistor and the second SSG transistor are connected in series) and is between the first select SSG transistor and the memory cell. In some implementation, there are more than one select transistor located between the memory cell and the BL. For example, there can be a first DSG transistor and a second DSG transistor, the second DSG transistor is connected to the first DSG transistor (e.g., the first DSG transistor and the second DSG transistor are connected in series) and is between the first select DSG transistor and the memory cell. In some implementation, in one corresponding memory string, there can be more than one DSG transistors connected in series and more than one SSG transistors connected in series.

In some implementation, when there are more than one select transistors (e.g., more than one SSG transistor and/or more than one DSG transistor in one corresponding memory string), during the first phase (e.g., a pre-program phase), first peak levels of the first voltages applied to the select lines coupled to select transistors connected in series (e.g., SSG transistors connected in series and/or DSG transistors connected in series) can be different and can be arranged according to the location of the select transistors. For example, when the distance between the select transistor and the CSL/BL increase, the first peak level of the first voltage applied to the select transistor decrease. Exemplary descriptions are given in the following with reference to FIG. 8A-FIG. 9B.

FIG. 8A illustrates an exemplary schematic diagram of a memory string of a memory device 800 provided by embodiments of the present disclosure. Memory device 800 may be a 3D NAND memory device which is similar to the memory device 600 as shown in the FIG. 6A. As shown in FIG. 6A and FIG. 8A, the main differences between the memory device 800 and the memory device 600 are that the memory string of the memory device 800 includes three SSG transistors connected in series, and the memory device 800 includes three SSG lines (which includes a SSG line_0, a SSG line_1, and a SSG line_2) respectively coupled to the three SSG transistors (which includes a SSG transistor 820, a SSG transistor 821, and a SSG transistor 822). As shown in the FIG. 8A, the SSG line_0, SSG line_1, and SSG line_2 are located between the CSL 802 and the word line coupled to the memory cell 830, and separately coupled to the SSG transistor 820, the SSG transistor 821, and the SSG transistor 822. For example, as shown in FIG. 8A, both the SSG transistor 821 and the SSG transistor 822 are between the SSG transistor 820 and the memory cell 830, and the SSG transistor 821 is between the SSG transistor 822 and the SSG transistor 820.

As shown in the FIG. 8A, the memory device 800 may include a memory stack 808, a memory string including a semiconductor channel 810, a bit line 812 and a source line 802; the memory stack 808 may include word lines and select lines; and select lines may include DSG line, SSG line_0, SSG line_1, and SSG line_2.

Inventors of the present disclosure have noted during research that, in case where the memory string of the memory device includes SSG transistors connected in series, the decrease degree of the threshold voltages (Vts) of the SSG transistors caused by erase operation are different, e.g., the decrease degree of the threshold voltage of the SSG transistor 821 is greater than the decrease degree of the threshold voltage of the SSG transistor 822, and is smaller than the decrease degree of the threshold voltage of the SSG transistor 820; inventors of the present disclosure have further noted during research that, by allowing the first peak levels of the first voltages V1 applied to the SSG lines coupled to the SSG transistors to be different, e.g., allowing the first peak level of the first voltage V1 applied to the SSG line_1 to be greater than the first peak level of the first voltage V1 applied to the SSG line_2 and to be smaller than the first peak level of the first voltage V1 applied to the SSG line_0, the difference between the threshold voltages (Vts) of the SSG transistors after the first phase can be decreased. Exemplary descriptions are given in the following with reference to FIG. 8B-FIG. 8C.

Figure 8B:
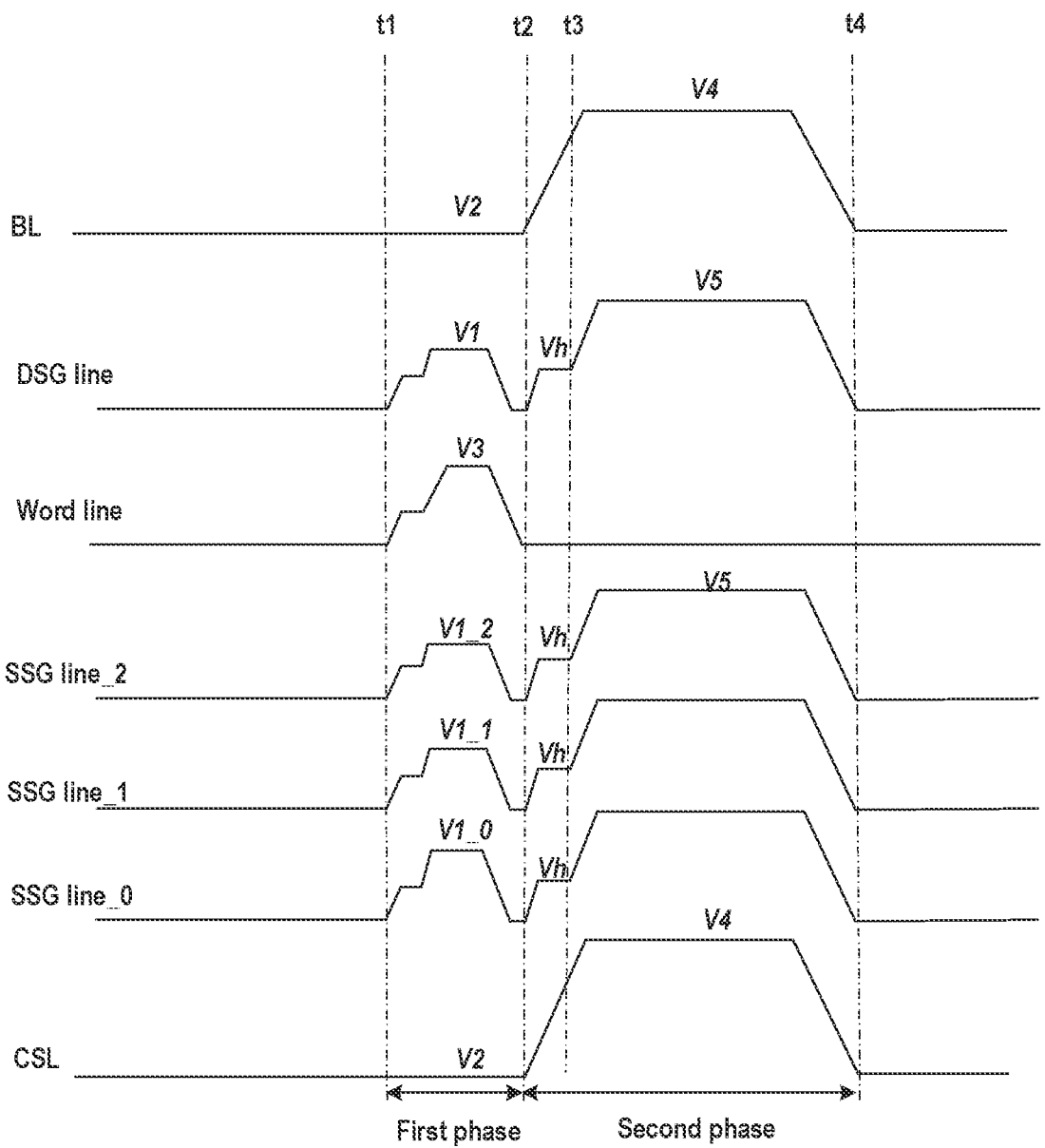
FIG. 8B illustrates a waveform diagram of for driving the memory device as shown in the FIG. 8A, according to some aspects of the present disclosure.

FIG. 8B illustrates an exemplary timing diagram or waveform diagram for driving the memory device 800 as shown in the FIG. 8A. The timing diagram as shown in the FIG. 8B is similar to the timing diagram as shown in the FIG. 7A, and thus only differences between the timing diagrams as shown in FIG. 7A and FIG. 8B will be described in the following, and no repeated content will be described for the sake of clarity.

As shown in the FIG. 8B, the erase operation can include a first phase and a second phase. For example, the arrangements of the second phase and the first phase can refer to embodiments related to FIG. 7A and FIG. 7B, and no further descriptions will be given for the sake of clarity.

As shown in FIG. 8B, the peripheral circuit (e.g., row decoder/word line driver 508 in FIG. 5) apply, during the first phase, first voltages V1 (which include a first voltage V1_0, a first voltage V1_1, and a first voltage V1_2) respectively to the SSG Line_0, the SSG Line_1 and the SSG Line_2.

In some implementation, the first voltages V1 applied to SSG Line_0, SSG Line_1 and SSG Line_2 can be different. For example, a first peak level of the first voltage V1_0 applied to the SSG line_0 is greater than a first peak level of the first voltage V1_1 applied to the SSG line_1, and a first peak level of the first voltage V1_1 is greater than a first peak level of the first voltage V1_2 applied to the SSG line_2. As a result, after the first phase (e.g., the pre-program phase), the increase of the Vt of the SSG transistor 820 is greater than the increase of the Vt of the SSG transistor 821, the increase of the Vt of the SSG transistor 821 is greater than the increase of the Vt of the SSG transistor 822. Thus, the Vts of the SSG transistors 820-822 can be adjusted to same or similar level.

In some implementation, the first voltages V1_0, V1_1, V1_2 are overlapped in time, such that the time periods for adjusting (e.g., correcting) the threshold voltages of the SSG transistors 820-822 can be overlapped, and the deterioration degree of the time duration of the erase operation can be reduced. In some implementation, the time period for adjusting (e.g., correcting) the threshold voltages of the SSG transistors 821-822 can be within the time period for adjusting (e.g., correcting) the threshold voltage of the SSG transistor 820, and the deterioration degree of the time duration of the erase operation can be further reduced. In some implementation, the first voltages V1_0, V1_1, and V1_2 can from same one voltage source. For example, by allowing the first voltages V1_0, V1_1, and V1_2 to be from same one voltage source, less voltage source is required. In some implementation, the first voltages V1_0, V1_1, and V1_2 can be ramp pulses and the pulse widths (or ramp up durations) of the first voltages V1_0, V1_1, and V1_2 can be controlled separately, such that the first peak levels of the first voltages V1_0, V1_1, and V1_2 can be controlled separately. Exemplary descriptions are given in the following with reference to FIG. 8C.

Figure 8C:
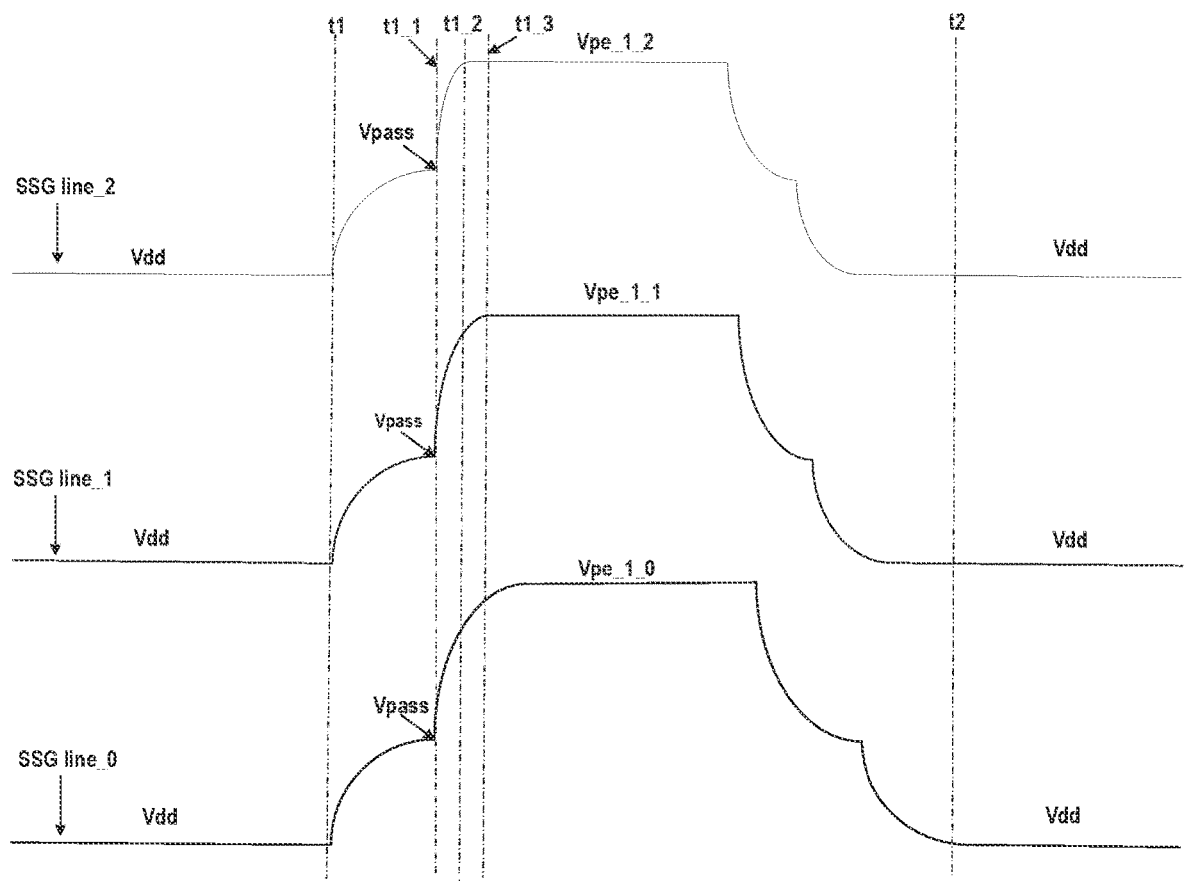
FIG. 8C illustrates exemplary voltage pulses applied to select lines of the memory device as shown in the FIG. 8A.

FIG. 8C illustrates exemplary voltage pulses applied to the SSG lines (SSG line_0-SSG line_2) during the first phase. In some implementation, the peripheral circuit (e.g., the decoder/word line driver 508 in FIG. 5) apply voltages that are from a same voltage source and generated by a voltage generator (e.g., the voltage generator 510 in FIG. 5) to the SSG line_0, SSG line_1, SSG line_2.

For example, as shown in the FIG. 8C, at time point t1, the voltage outputted from the same voltage source is the voltage Vdd, and begins to ramp up; at time point t1_1, the voltage outputted from the same voltage source are ramped up to the voltage Vpass; correspondingly, the voltages V1_0, V1_1 and V1_2 are ramped up along with the voltage outputted from the same voltage source, from the voltage Vdd at t1 to the voltage Vpass at t1_1, the voltage Vpass can, e.g., allow the SSG transistors 821-822 to be turned on. During the time period between the time point t1_1 and time point t1_2, the voltage outputted from the same voltage source continue to ramp up, and thus the voltages V1_0, V1_1 and V1_2 ramp up along with the voltage outputted from the same voltage source (e.g., the voltages V1_0, V1_1 and V1_2 ramp up synchronously). At the time point t1_2, the peripheral circuit (e.g., the decoder/word line driver 508 in FIG. 5) disconnects the SSG line_2 from the same voltage source, Thus, the voltage V1_2 ramped up to the first peak level of the first voltage V1_2 (Vpe_1_2) at the time point t1_2. During the time period between t1_2 and t1_3, the voltage outputted from the same voltage source continue to ramp up, and is still applied to the SSG line_1 and SSG line_0, and thus the voltage V1_1 and V1_0 ramp up along with the voltage outputted from the same voltage source (e.g., the voltages V1_1 and V1_0 ramp up synchronously). At time point t1_3, the peripheral circuit (e.g., the decoder/word line driver 508 in FIG. 5) disconnects the SSG line_1 from the same voltage source, Thus, the voltage V1_1 ramped up to the first peak level of the first voltage V1_1 (Vpe_1_1) that is greater than Vpe_1_2 at the time point t1_2. After the time point t1_3, the voltage V1_0 continue to ramp up and ramp up to the first peak level of the first voltage V1_0 (Vpe_1_0) that is greater than Vpe_1_1.

FIG. 9A illustrates an exemplary schematic diagram of a memory string of a memory device 900 provided by embodiments of the present disclosure. Memory device 900 may be a 3D NAND memory device which is similar to the memory device 600 as shown in the FIG. 6A. As shown in FIG. 6A and FIG. 9A, the main differences between the memory device 900 and the memory device 600 are that the memory device 900 includes three DSG lines (which includes a DSG line_0, a DSG line_1, and a DSG line_2) respectively coupled to the three DSG transistors (which includes a DSG transistor 920, a DSG transistor 921, and a DSG transistor 922). As shown in the FIG. 9A, the DSG line_0, DSG line_1, and DSG line_2 are located between the BL 912 and the word line coupled to the memory cell 930, and separately coupled to the DSG transistor 920, DSG transistor 921, DSG transistor 922. For example, as shown in FIG. 9A, both the DSG transistor 921 and the DSG transistor 922 are between the DSG transistor 920 and the memory cell 930, and the DSG transistor 921 is between the DSG transistor 922 and the DSG transistor 920.

As shown in the FIG. 9A, the memory device 900 may include a memory stack 908, a memory string including a semiconductor channel 910, a bit line 912 and a source line 902; the memory stack 908 may include word lines and select lines; and select lines may include SSG line, DSG line_0, DSG line_1, and DSG line_2.

Inventors of the present disclosure have noted during research that, in case where the memory string of the memory device includes DSG transistors connected in series, the decreases of the threshold voltages (Vts) of the DSG transistors caused by erase operation are different, e.g., the decrease of the threshold voltage of the DSG transistor 921 is greater than the decrease of the threshold voltage of the DSG transistor 922, and is smaller than the decrease of the threshold voltage of the DSG transistor 920; inventors of the present disclosure have further noted during research that, by allowing the first peak levels of the first voltages V1 applied to the DSG lines coupled to the DSG transistors to be different, e.g., allowing the first peak level of the first voltage V1 applied to the DSG line_1 to be greater than the first peak level of the first voltage V1 applied to the DSG line_2 and to be smaller than the first peak level of the first voltage V1 applied to the DSG line_0, the difference between the threshold voltages (Vts) of the DSG transistors after the first phase can be decreased. Exemplary descriptions are given in the following with reference to FIG. 9B.

Figure 9B:
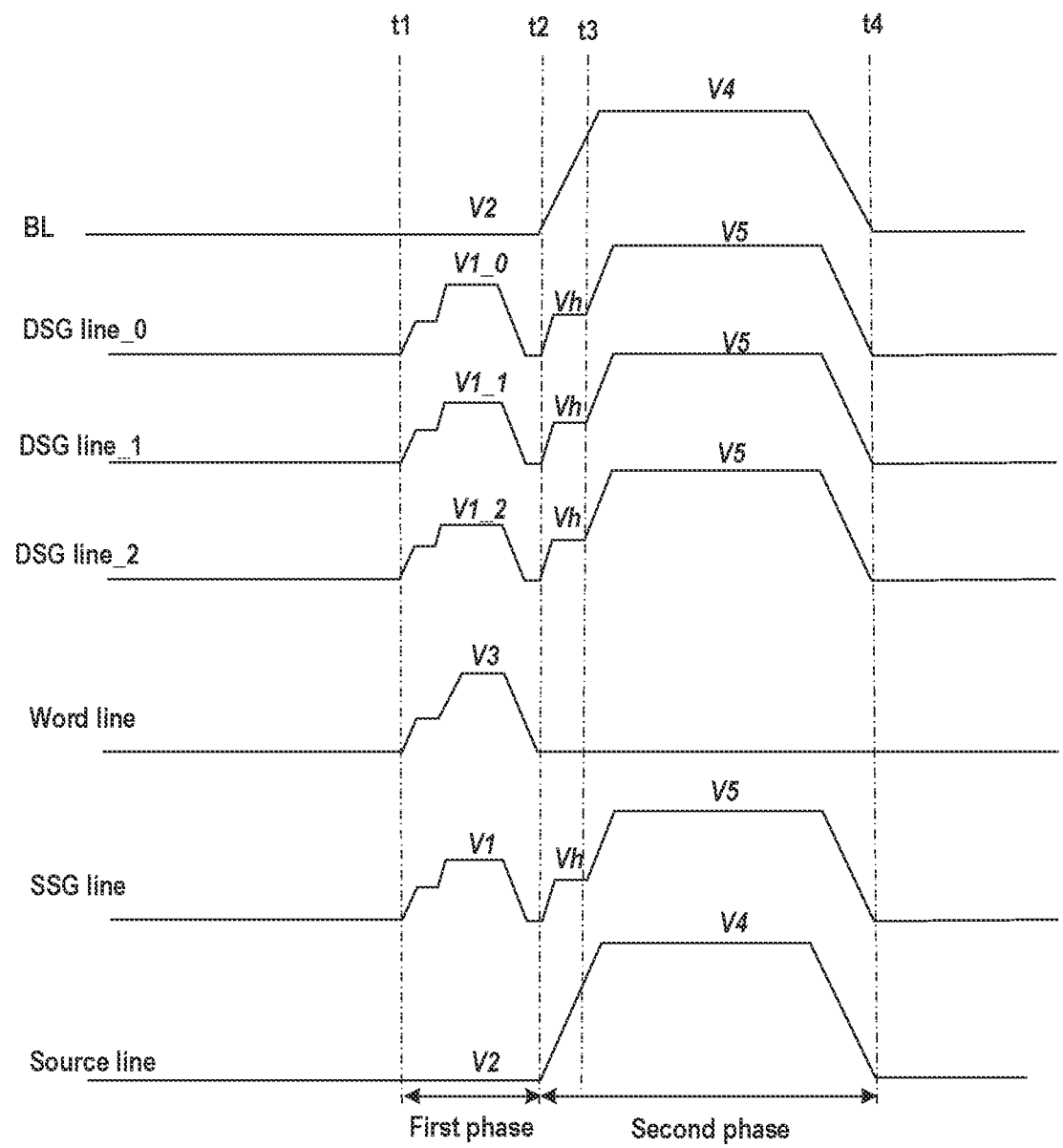
FIG. 9B illustrates a waveform diagram for driving the memory device as shown in the FIG. 9A, according to some aspects of the present disclosure.

FIG. 9B illustrates an exemplary timing diagram or waveform diagram for driving the memory device 900 as shown in the FIG. 9A. The timing diagram as shown in the FIG. 9B is similar to the timing diagram as shown in the FIG. 7A, and thus only differences between the timing diagrams as shown in FIG. 7A and FIG. 9B will be described in the following, and no repeated content will be described for the sake of clarity.

As shown in the FIG. 9B, the erase operation can include a first phase and a second phase. For example, the arrangements of the second phase and the first phase can refer to embodiments related to FIG. 7A and FIG. 7B, and no further descriptions will be given for the sake of clarity.

As shown in FIG. 9B, the peripheral circuit (e.g., row decoder/word line driver 508 in FIG. 5) apply, during the first phase, first voltages V1 (which include a first voltage V1_0, a first voltage V1_1, and a first voltage V1_2) respectively to the DSG Line_0, DSG Line_1 and DSG Line_2.

In some implementation, the first voltages V1 applied to DSG Line_0, DSG Line_1 and DSG Line_2 can be different. For example, a first peak level of the first voltage V1_0 applied to the DSG line_0 is greater than a first peak level of the first voltage V1_1 applied to the DSG line_1, a first peak level of the first voltage V1_1 is greater than a first peak level of the first voltage V1_2 applied to the DSG line_2. As a result, after the first phase (e.g., the pre-program phase), the increase of the Vt of the DSG transistor 920 is greater than the increase of the Vt of the DSG transistor 921, the increase of the Vt of the DSG transistor 921 is greater than the increase of the Vt of the DSG transistor 922. Thus, the Vts of the DSG transistors 920-922 can be adjusted to same or similar level.

In some implementation, the first voltages V1_0, V1_1, V1_2 applied to the DSG lines are overlapped in time, such that the time periods for adjusting (e.g., correcting) the threshold voltages of the DSG transistors 920-922 can be overlapped, and the deterioration degree of the time duration of the erase operation can be reduced. In some implementation, the time period for adjusting (e.g., correcting) the threshold voltages of the DSG transistors 921-922 can be within the time period for adjusting (e.g., correcting) the threshold voltage of the DSG transistor 920, and the deterioration degree of the time duration of the erase operation can be further reduced. In some implementation, the first voltages V1_0, V1_1, and V1_2 applied to the DSG lines can from same one voltage source. For example, by allowing the first voltages V1_0, V1_1, and V1_2 applied to the DSG lines to be from same one voltage source, less voltage source is required. In some implementation, the first voltages V1_0, V1_1, and V1_2 applied to the DSG lines can be ramp pulses and the pulse widths (or ramp up durations) of the first voltages V1_0, V1_1, and V1_2 applied to the DSG lines can be controlled separately, such that the first peak levels of the first voltages V1_0, V1_1, and V1_2 applied to the DSG lines can be controlled separately. Exemplary descriptions are given in the following with reference to FIG. 9C.

Figure 9C:
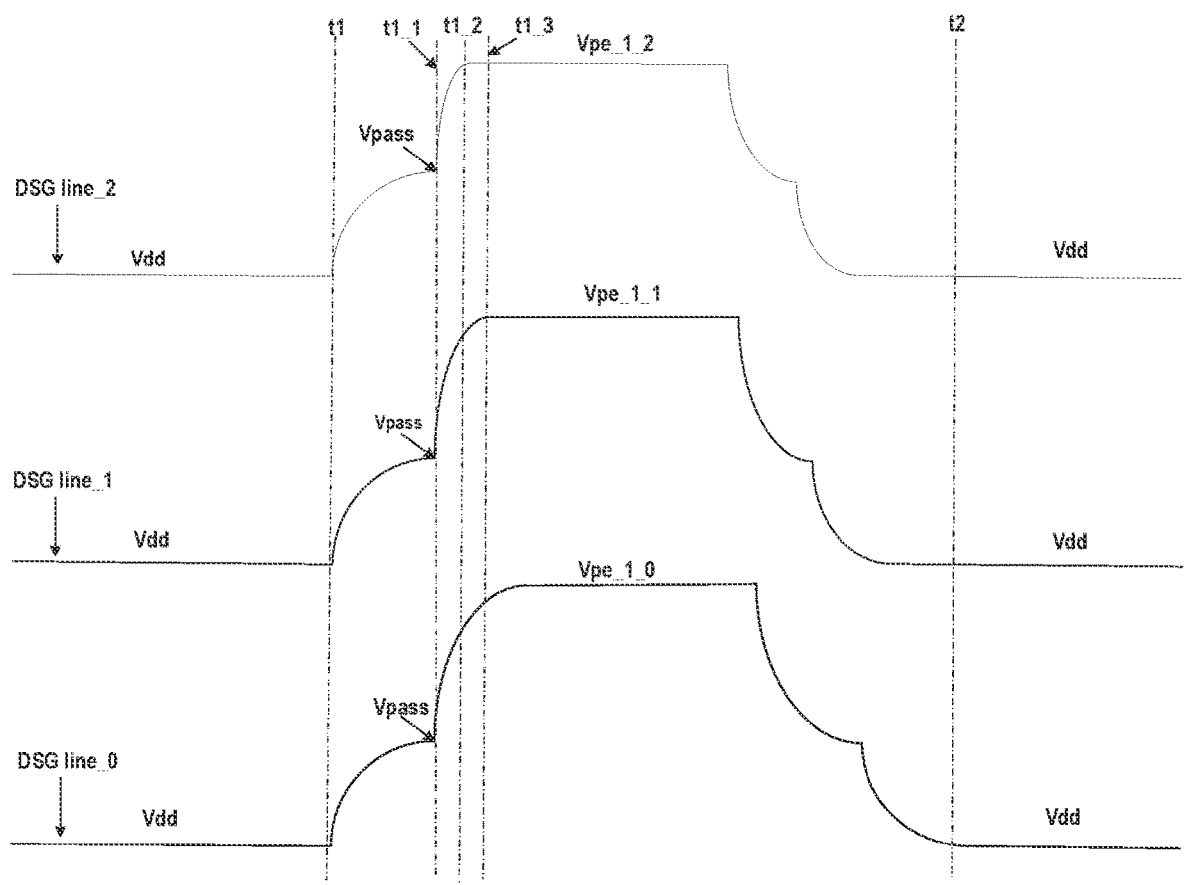
FIG. 9C illustrates exemplary voltage pulses applied to select lines of the memory device as shown in the FIG. 9A.

FIG. 9C illustrates exemplary voltage pulses applied to the DSG lines (DSG line_0-DSG line_2) during the first phase. In some implementation, the peripheral circuit (e.g., the decoder/word line driver 508 in FIG. 5) apply voltages that are from a same voltage source Vdd and generated by a voltage generator (e.g., the voltage generator 510 in FIG. 5) to the DSG line_0, DSG line_1, DSG line_2.

For example, as shown in the FIG. 9C, at time point t1, the voltage outputted from the same voltage source is the voltage Vdd and begins to ramp up; at time point t1_1, the voltage outputted from the same voltage source are ramped up to the voltage Vpass; correspondingly, the voltages V1_0, V1_1 and V1_2 applied to the DSG lines are ramped up along with the voltage outputted from the same voltage source, from the voltage Vdd at t1 to the voltage Vpass at t1_1, the voltage Vpass can, e.g., allow the DSG transistors 921-922 to be turned on. During the time period between the time point t1_1 and time point t1_2, the voltage outputted from the same voltage source continue to ramp up, and thus the voltages V1_0, V1_1 and V1_2 applied to the DSG lines ramp up along with the voltage outputted from the same voltage source (e.g., the voltages V1_0, V1_1 and V1_2 applied to the DSG lines ramp up synchronously). At the time point t1_2, the peripheral circuit (e.g., the decoder/word line driver 508 in FIG. 5) disconnects the DSG line_2 from the same voltage source, Thus, the voltage V1_2 applied to the DSG line_2 ramped up to the first peak level of the first voltage V1_2 (Vpe_1_2) at the time point t1_2. During the time period between time point t1_2 and t1_3, the voltage outputted from the same voltage source continue to ramp up, and is still applied to the DSG line_1 and DSG line_0, and thus the voltage V1_1 and V1_0 applied to the DSG lines (the DSG line_1, DSG line_0) ramp up along with the voltage outputted from the same voltage source (e.g., the voltages V1_1 and V1_0 ramp up synchronously). At time point t1_3, the peripheral circuit (e.g., the decoder/word line driver 508 in FIG. 5) disconnects the DSG line_1 from the same voltage source, Thus, the voltage V1_1 applied to the DSG line_1 ramped up to the first peak level of the first voltage V1_1 (Vpe_1_1) that is greater than Vpe_1_2 at the time point t1_2. After the time point t1_3, the voltage V1_0 applied to the DSG line_0 continue to ramp up and ramp up to the first peak level of the first voltage V1_0 (Vpe_1_0) that is greater than Vpe_1_1.

In some implementation, the first voltages V1_0, V1_1, V1_2 as shown in the FIG. 8B can be respectively the same as or different from the first voltages V1_0, V1_1, V1_2 as shown in the FIG. 9B. In some implementation, the voltages Vpe_1_0, Vpe_1_1, Vpe_1_2 as shown in the FIG. 8C can be respectively the same as or different from the voltages Vpe_1_0, Vpe_1_1, Vpe_1_2 as shown in the FIG. 9C.

Although the FIG. 8A and FIG. 9A respectively illustrate the case where more than one SSG transistor and only one DSG transistor are in the memory string, and the case where more than one DSG transistor and only one SSG transistor are in the memory string, it should be understood that embodiments of the present disclosure are not limited to these cases. In some implementation, there can be more than one SSG transistor (e.g., SSG transistors connected in series) at, e.g., the bottom of the memory string and more than one DSG transistor (e.g., DSG transistors connected in series) at, e.g., the top of the memory string. The timing diagrams for driving the SSG transistors and DSG transistors of the memory device can respectively adopt a timing diagram same as or similar to the timing diagram for driving the SSG transistors as shown in the FIG. 8B and a timing diagram same as or similar to the timing diagram for driving the DSG transistors as shown in FIG. 9B.

Figure 10:
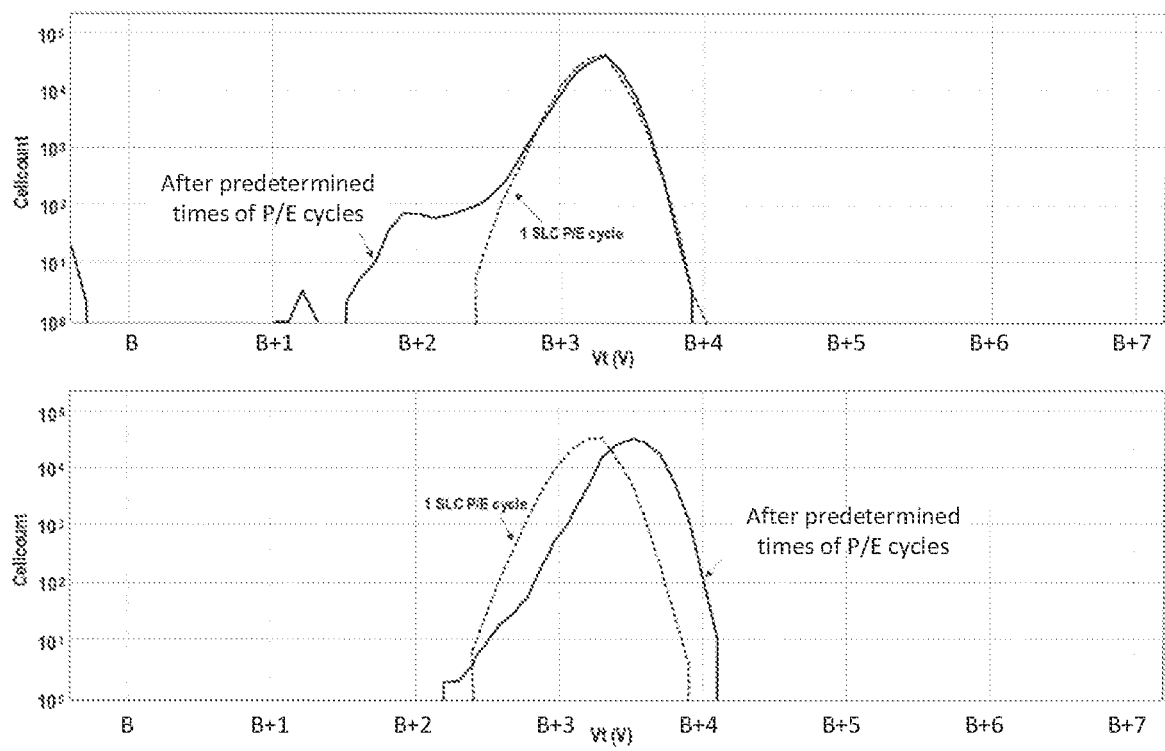
FIG. 10 illustrates comparisons of Vt distributions of SSG transistors according to some aspects of the present disclosure.

FIG. 10 illustrates comparisons of Vt distributions of SSG transistors. Specifically, FIG. 10 illustrates the comparison of Vt distributions of SSG transistors between the case where one program/erase cycle (SLC) is performed and the case where predetermined times of program/erase cycles (SLC) are performed. For example, the predetermined times can be set according to implementation needs. For example, the predetermined times can be larger than 1000 times (e.g., larger than 10000 times). For example, the predetermined times can be smaller than 200000 times (e.g., smaller than 100000 times). In FIG. 10, B is a predetermined value (e.g., a negative value), and can be set according to implementation needs, and no further descriptions will be given.

The top picture illustrates the case where no first voltage V1 is applied to a corresponding SSG line. As can be seen from the top picture of FIG. 10, in case where no first voltage V1 is applied to a corresponding SSG line, the lower edge of the threshold voltage (Vt) distribution extends leftwards (i.e., the lower edge of the Vt distribution corresponds to smaller threshold voltages), when predetermined times of program/erase cycles are performed.

The bottom picture illustrates the case where a first voltage V1 is applied to a corresponding SSG line during the first phase. As can be seen from the bottom picture of FIG. 10, in the case where a first voltage V1 is applied to a corresponding SSG line during the first phase, the two Vt distributions of SSG transistors are quite similar.

As can be seen from the top and bottom pictures of FIG. 10, in the case where predetermined times of program/erase cycles are performed, if a first voltage V1 is applied to a corresponding SSG line during the first phase, threshold voltages (Vts) of less (e.g., much less) select transistors are decreased, as compared with the case where no first voltage V1 is applied to a corresponding SSG line. For example, the applying of the voltage V1 can adjust the Vt distribution of the SSG transistors to a preferred level or range that can enhance the efficiency of the GIDL erase.

Embodiments of the present disclosure provides a method for operating a memory device. The memory device includes: a common source line (CSL), a bit line (BL), a memory string, a word line and a select line. The memory string includes: a memory cell, a select transistor comprising a storage layer. The word line is coupled to the memory cell, the select line is coupled to the select transistor. The method includes applying a first voltage to the select line; and applying a second voltage to the CSL and/or the BL, in which a first peak level of the first voltage is greater than a second peak level of second voltage. Exemplary descriptions are given in the following with reference to FIG. 11 and FIG. 12.

Figure 11:
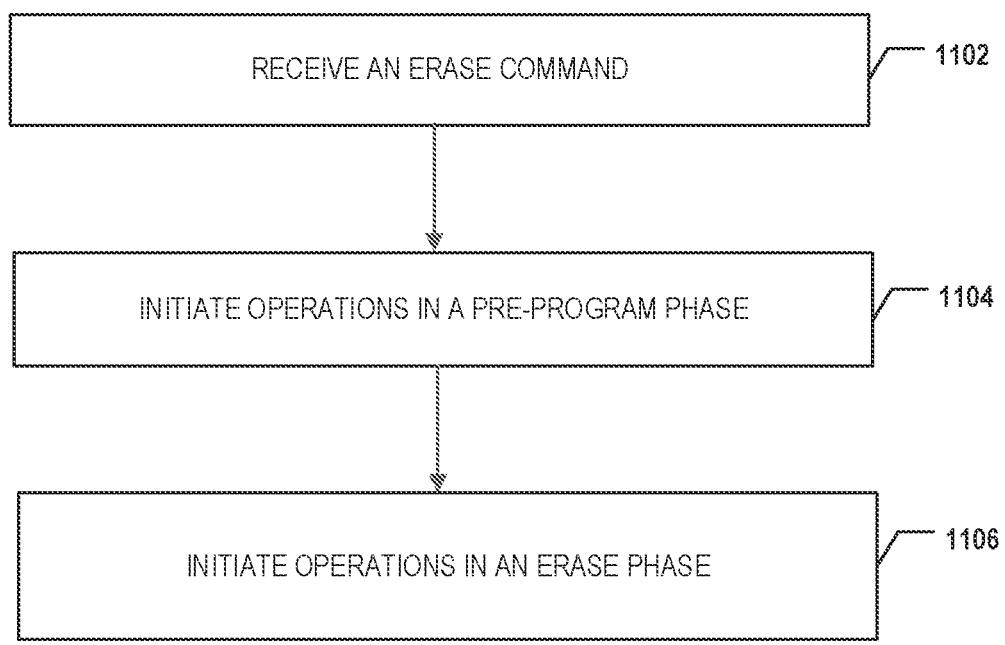
FIG. 11 illustrates an exemplary flowchart of a method for operating a memory device, according to some aspects of the present disclosure.

FIG. 11 illustrates a flowchart of a method for operating a memory device, according to some aspects of the present disclosure. The memory device may be any suitable memory device disclosed herein, such as the memory device 300 as shown in FIG. 3, the memory device 400 as shown in FIG. 4A, the memory device 600 as shown in FIG. 6A, the memory device 800 as shown in FIG. 8A, or the memory device 900 as shown in FIG. 9A.

Method may be implemented by peripheral circuits (e.g., peripheral circuits 302 as shown in FIG. 3), and the peripheral circuits may include, e.g., control logic 512 and row decoder/word line driver 508 in FIG. 5. It should be understood that the operations as shown in method may not be exhaustive and that other operations can be performed as well before, after, or between any of the illustrated operations. Further, some of the operations may be performed simultaneously, or in a different order than shown in FIG. 11.

Referring to FIG. 11, method starts at operation 1102, in which an erase command is received. For example, control logic 512 may receive an erase command from a memory controller (e.g., memory controller 106 in FIG. 1) through interface (UF) 516.

Method proceeds to operation 1104, as illustrated in FIG. 11, in which operations in a pre-program phase are initiated in response to receiving the erase command. For example, control logic 512 may send control signals to at least row decoder/word line driver 508, column decoder/bit line driver 506, and voltage generator 510 to initiate the pre-program operation. In some implementations, as shown in FIG. 12, word line driver 508 applies a first voltage to the select line, while a second voltage is applied to the CSL by the word line driver 508 or a second voltage is applied to the BL by the bit line driver 506, in which a first peak level of the first voltage is greater than a second peak level of second voltage.

Method proceeds to operation 1106, as illustrated in FIG. 11, in which operations in an erase phase are initiated. For example, control logic 512 may send control signals to at least row decoder/word line driver 508, column decoder/bit line driver 506, and voltage generator 510, to initiate the erase operation. In some implementations, a positive voltage are applied on the CSL/BL after discharging the first voltage on the select line, and the decoder/word line driver apply a voltage, that is smaller than the positive voltage, on the word line during the time period of applying the positive voltage.

Figure 12:
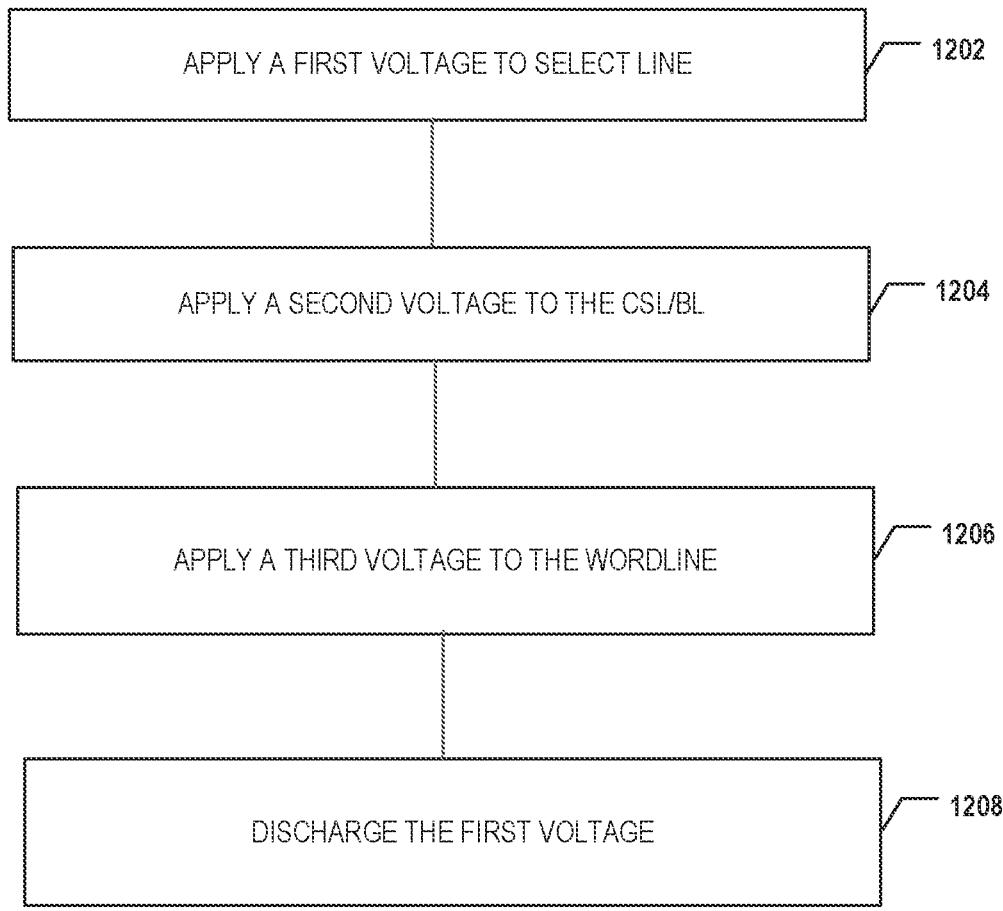
FIG. 12 illustrates an exemplary flowchart of a pre-program operation for operating a memory device, according to some aspects of the present disclosure.

As shown in FIG. 12, during operation 1104 as shown in the FIG. 11, a first voltage is applied, by for example word line driver 508, to the select line during performing operation 1202, and a second voltage is applied to the CSL during performing operation 1204. Where a first peak level of the first voltage is greater than a second peak level of second voltage. Alternatively, the operation 1204 can also be accomplished by applying a second voltage on the BL by for example the bit line driver 506. In some other examples, the second voltage are applied to the CSL as well as the BL in operation 1204. In some implementations, during performing operation 1206, a third voltage is applied, by for example word line driver 508, to the word line. a third peak level of the third voltage is greater than a first peak level of the first voltage. In some implementations, operation 1106 is performed after the first voltage on the select line is discharged.

In some implementations, during performing operation 1206, word line driver 508 discharges the first voltage on selected word line.

In some implementation, operations 1102-1106 are sequentially performed. In some implementation, the method for operating the memory device does not include operation 1102, and operations 1104-1106 can be initiated in response to receiving any other suitable command. In some implementation, time periods for performing operations 1202 and 1204 can be overlapped (e.g., completely overlapped). In some implementation, time periods for performing operations 1202 and 1204 can be overlapped (e.g., completely overlapped) with time period for performing operation 1206. In some implementations, operation 1104 can be performed in a time period other than pre-program phase. In some implementations, operations 1202 and 1204 can be performed in a time period other than pre-program phase, and in these implementations, time periods for performing operations 1202 and 1204 is not overlapped with time period for performing operation 1206, or operation 1104 does not include operation 1206. In some implementations, operation 1208 is after operations 1202-1206. In some implementations, operation 1104 does not include operation 1208. For example, details and modifications regarding to the method for operating the memory device can refer to descriptions related to FIG. 1-FIG. 10, and no further descriptions will be given for the sake of clarity.

Various methods for operating a memory device disclosed herein can be realized via hardware and/or software, such as a non-transitory tangible storage medium having a set of instructions stored thereon, that, upon being implemented by a controller, the set of instructions cause a peripheral circuit of a memory device to perform operations including the steps described above.

Figure 13:
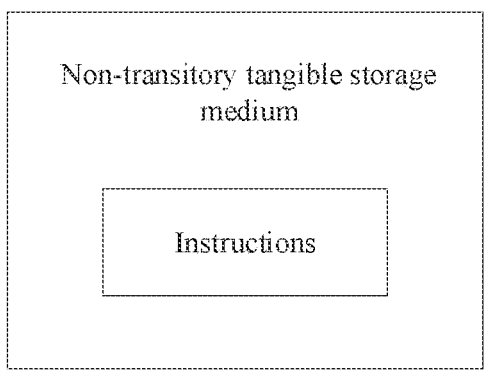
FIG. 13 illustrates a block diagram of an exemplary non-transitory tangible storage medium, according to some aspects of the present disclosure.

Embodiments of the present disclosure provides a non-transitory tangible storage medium. FIG. 13 illustrates a block diagram of an exemplary non-transitory tangible storage medium, according to some aspects of the present disclosure.

As shown in FIG. 13, The non-transitory tangible storage medium stores a set of instructions, where upon being implemented by a controller, the set of instructions cause a peripheral circuit of a memory device to: apply a first voltage to a select line coupled to a select transistor of a memory string of the memory device; and apply a second voltage to a source line (SL) and/or a bit line (BL) of the memory device, in which a first peak level of the first voltage is greater than a second peak level of second voltage. For example, the non-transitory tangible storage medium can be memory in the controller. For example, the set of instructions can be implemented by a processer in the controller.

For example, upon being implemented by the controller, the set of instructions further cause the peripheral circuit to apply a third voltage to a word line coupled to a memory cell of the memory string.

For example, a third peak level of the third voltage is greater than a first peak level of the first voltage.

For example, the first voltage are applied to the select line before an erase operation of the memory string.

For example, details and modifications regarding to the storage medium can refer to descriptions related to FIG. 1-FIG. 10, and no further descriptions will be given for the sake of clarity.

According to one aspect of the present disclosure, a memory device is provided. The memory device includes: a source line (SL), bit line (BL), a memory string, a word line, a select line, and a peripheral circuit coupled to the SL, the BL, the select line, and the word line. The memory string includes: a memory cell, and a select transistor including a storage layer. The word line is coupled to the memory cell, the select line is coupled to the select transistor. The peripheral circuit is configured to: apply a first voltage to the select line, apply a second voltage to the SL and/or the BL, in which a first peak level of the first voltage is greater than a second peak level of second voltage.

In some implementations, the select transistor includes a source select gate (SSG) transistor, the select line includes a SSG line, and the applying the first voltage to the select line includes applying the first voltage to the SSG line.

In some implementations, the select transistor further includes a drain select gate (DSG) transistor, the select line further includes a DSG line, and the applying the first voltage to the select line further includes applying the first voltage to the DSG line.

In some implementations, the select transistor includes a first select transistor and a second select transistor; the second select transistor is connected to the first select transistor, and is between the first select transistor and the memory cell; and a first peak electrical level of the first voltage applied to the select line coupled to the second gate transistor is smaller than a first peak electrical level of the first voltage applied to the select line coupled to the first select gate transistor.

In some implementations, the first voltage applied to the select line coupled to the second select transistor and the first voltage applied to the select line coupled to the first select transistor are overlapped in time, a ramp up duration of the first voltage applied to the select line coupled to the first select transistor is larger than a ramp up duration of the first voltage applied to the select line coupled to the second select transistor.

In some implementations, the peripheral circuit is further configured to: apply a third voltage to the word line.

In some implementations, a third peak electrical level of the third voltage is greater than the first peak electrical level of the first voltage.

In some implementations, the first voltage and the third voltage are overlapped in time.

In some implementations, the first voltage and the third voltage are from same one voltage source.

In some implementations, ramp up duration of the third voltage is greater than a ramp up duration of the first voltage.

In some implementations, the peripheral circuit is further configured to: discharge the first voltage on the select line; apply a positive voltage on the SL/BL after discharging the first voltage on the select line; and apply a voltage, which is smaller than the positive voltage, on the word line while applying the positive voltage.

In some implementations, the first voltage is applied to the select line before an erase operation of the memory string.

In some implementations, the second voltage is a ground voltage, and the first peak electrical level of the first voltage is greater than a pass voltage.

According to another aspect of the present disclosure, a system is provided. The system includes: a memory controller coupled to a memory device and configured to transmit a command to the memory device. The memory device includes a source line (SL), bit line (BL), a memory string, a word line, a select line, and a peripheral circuit coupled to the memory string. The memory string includes: a memory cell, a select transistor including a storage layer. The word line is coupled to the memory cell, the select line is coupled to the select transistor. The peripheral circuit is configured to: in response to receiving the command, apply a first voltage to the select line, apply a second voltage to the SL and/or the BL, in which a first peak electrical level of the first voltage is greater than a second peak electrical level of second voltage.

In some implementations, the second voltage is a ground voltage, and the first peak level of the first voltage is greater than a pass voltage.

In some implementations, the system is a solid-state drive (SSD) or a memory card; and the command is an erase command.

According to still another aspect of the present disclosure, a method for operating a memory device is provided. The memory device includes: a source line (SL), a bit line (BL), a memory string, a word line and a select line. The memory string including: a memory cell, a select transistor including a storage layer. The word line is coupled to the memory cell, the select line is coupled to the select transistor. The method includes apply a first voltage to the select line; and apply a second voltage to the SL and/or the BL, in which a first peak electrical level of the first voltage is greater than a second peak electrical level of second voltage.

In some implementations, applying a third voltage to the word line.

In some implementations, a third peak electrical level of the third voltage is greater than a first peak electrical level of the first voltage.

In some implementations, the first voltage is applied to the select line before an erase operation of the memory string.

According to still another aspect of the present disclosure, a non-transitory tangible storage medium storing a set of instructions is provided, where upon being implemented by a controller, the set of instructions cause a peripheral circuit of a memory device to: apply a first voltage to a select line coupled to a select transistor of a memory string of the memory device; and apply a second voltage to a source line (SL) and/or a bit line (BL) of the memory device, in which a first peak level of the first voltage is greater than a second peak level of second voltage.

In some implementations, upon being implemented by the controller, the set of instructions further cause the controller to control the peripheral circuit to apply a third voltage to a word line coupled to a memory cell of the memory string.

In some implementations, a third peak level of the third voltage is greater than a first peak level of the first voltage.

In some implementations, the first voltage are applied to the select line before an erase operation of the memory string.

According to still another aspect of the present disclosure, another memory device is provided. The memory device includes a source line (SL), a bit line (BL), a memory string, a word line, a select line and a peripheral circuit. The memory string includes a memory cell and a select transistor including a storage layer. The word line is coupled to the memory cell. The select line is coupled to the select transistor. The peripheral circuit is coupled to the SL, the BL, the select line, and the word line. The peripheral circuit is configured to: generate a first signal carrying a first voltage to be applied to the select line; generate a second signal carrying a second voltage to be applied to the SL and/or the BL, in which a first peak level of the first voltage is greater than a second peak level of second voltage.

In some implementations, the select transistor includes a source select gate (SSG) transistor, the select line includes a SSG line, and the first signal is to be applied to the SSG line.

In some implementations, the select transistor further includes a drain select gate (DSG) transistor, the select line further includes a DSG line, and the first signal is further to be applied to the DSG line.

In some implementations, the select transistor includes a first select transistor and a second select transistor; the second select transistor is connected to the first select transistor, and is between the first select transistor and the memory cell; and a first peak level of the first voltage carried by the first signal to be applied to the select line coupled to the second gate transistor is smaller than a first peak level of the first voltage carried by the first signal to be applied to the select line coupled to the first select gate transistor.

In some implementations, the first voltage carried by the first signal to be applied to the select line coupled to the second select transistor and the first voltage carried by the first signal to be applied to the select line coupled to the first select transistor are overlapped in time, a ramp up duration of the first voltage carried by the first signal to be applied to the select line coupled to the first select transistor is larger than a ramp up duration of the first voltage carried by the first signal to be applied to the select line coupled to the second select transistor.

In some implementations, the peripheral circuit is further configured to: generate a third signal carrying a third voltage to be applied to the word line.

In some implementations, a third peak level of the third voltage is greater than the first peak level of the first voltage.

In some implementations, a third peak level of the third voltage is greater than the first peak level of the first voltage.

In some implementations, the first voltage and the third voltage are overlapped in time.

In some implementations, the first signal and the third signal are generated by same one voltage source of the peripheral circuit.

In some implementations, a ramp up duration of the third voltage is greater than a ramp up duration of the first voltage.

In some implementations, the peripheral circuit is further configured to: discharge the first voltage on the select line; generate a fourth signal carrying a positive voltage to be applied to the SL/BL after discharging the first voltage on the select line; and generate a word line signal carrying a voltage, that is smaller than the positive voltage, to be applied to the word line, and the word line signal is applied to the word line while applying the fourth signal.

In some implementations, the first signal is generated before an erase phase of an erase operation of the memory string.

In some implementations, the second voltage is a ground voltage, and the first peak level of the first voltage is greater than a pass voltage.

According to still another aspect of the present disclosure, another system is provided. The system includes a memory device and a memory controller coupled to the memory device and configured to transmit a command to the memory device. The memory device includes a source line (SL), a bit line (BL), a memory string, a word line, a select line and a peripheral circuit. The memory string includes a memory cell and a select transistor including a storage layer. The word line is coupled to the memory cell. The select line is coupled to the select transistor. The peripheral circuit is coupled to the SL, the BL, the select line, and the word line. The peripheral circuit is configured to, in response to receiving the command, generate a first signal carrying a first voltage to be applied to the select line; and generate a second signal carrying a second voltage to be applied to the SL and/or the BL, in which a first peak level of the first voltage is greater than a second peak level of second voltage.

According to still another aspect of the present disclosure, another method for operating a memory device is provided. The memory device includes a source line (SL), a bit line (BL), a memory string, a word line, and a select line. The memory string includes a memory cell and a select transistor including a storage layer. The word line is coupled to the memory cell. The select line is coupled to the select transistor. The method includes generating a first signal carrying a first voltage to be applied to the select line; and generating a second signal carrying a second voltage to be applied to the SL and/or the BL, in which a first peak level of the first voltage is greater than a second peak level of second voltage.

According to still another aspect of the present disclosure, another non-transitory storage medium is provided. The non-transitory storage medium stores a set of instructions, where upon being implemented by a controller, the set of instructions cause a peripheral circuit of a memory device to: generate a first signal carrying a first voltage to be applied to a select line coupled to a select transistor of a memory string of the memory device; and generate a second signal carrying a second voltage to be applied to a source line (SL) and/or a bit line (BL) of the memory device, in which a first peak level of the first voltage is greater than a second peak level of second voltage.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A memory device, comprising:
a source line (SL) and a bit line (BL);
a memory string comprising:
 a memory cell,
 a select transistor comprising a storage layer,
 a word line coupled to the memory cell;
 a select line coupled to the select transistor; and
a peripheral circuit coupled to the SL, the BL, the select line, and the word line,
wherein the peripheral circuit is configured to:
 apply a first voltage to the select line;
 apply a second voltage to at least one of the SL or the BL; and
 apply a third voltage to the word line, wherein a first peak level of the first voltage is greater than a second peak level of second voltage, and a third peak level of the third voltage is greater than the first peak level of the first voltage.

2. The memory device of claim 1, wherein the select transistor comprises a source select gate (SSG) transistor, the select line comprises a SSG line, and applying the first voltage to the select line comprises applying the first voltage to the SSG line.

3. The memory device of claim 2, wherein the select transistor further comprises a drain select gate (DSG) transistor, the select line further comprises a DSG line, and applying the first voltage to the select line further comprises applying the first voltage to the DSG line.

4. The memory device of claim 1, wherein the select transistor comprises a first select transistor and a second select transistor;
- the second select transistor is connected to the first select transistor, and is between the first select transistor and the memory cell; and
- a first peak level of the first voltage applied to the select line coupled to a second gate transistor is smaller than a first peak level of the first voltage applied to the select line coupled to a first select gate transistor.

5. The memory device of claim 4, wherein the first voltage applied to the select line coupled to the second select transistor and the first voltage applied to the select line coupled to the first select transistor are overlapped in time, a ramp up duration of the first voltage applied to the select line coupled to the first select transistor is larger than a ramp up duration of the first voltage applied to the select line coupled to the second select transistor.

6. The memory device of claim 1, wherein the first voltage and the third voltage are overlapped in time.

7. The memory device of claim 1, wherein the first voltage and the third voltage are from same one voltage source.

8. The memory device of claim 1, wherein a ramp up duration of the third voltage is greater than a ramp up duration of the first voltage.

9. The memory device of claim 1, wherein the peripheral circuit is further configured to:
- discharge the first voltage on the select line;
- apply a positive voltage on at least one of the SL or the BL after discharging the first voltage on the select line; and
- apply a voltage, that is smaller than the positive voltage, on the word line while applying the positive voltage.

10. The memory device of claim 1, wherein the first voltage is applied to the select line before an erase phase of an erase operation of the memory string.

11. The memory device of claim 1, wherein the second voltage is a ground voltage, and the first peak level of the first voltage is greater than a pass voltage.

12. A system, comprising:
- a memory controller coupled to a memory device and configured to transmit a command to the memory device; and
- the memory device comprising:
  - a source line (SL) and a bit line (BL),
  - a memory string comprising:
    - a memory cell, and
    - a select transistor comprising a storage layer,
  - a word line coupled to the memory cell,
  - a select line coupled to the select transistor, and
  - a peripheral circuit coupled to the SL, the BL, the select line, and the word line and configured to, in response to receiving the command,
    - apply a first voltage to the select line;
    - apply a second voltage to at least one of the SL or the BL; and
    - apply a third voltage to the word line, wherein a first peak level of the first voltage is greater than a second peak level of second voltage, and a third peak level of the third voltage is greater than the first peak level of the first voltage.

13. The system of claim 12, wherein the second voltage is a ground voltage, and the first peak level of the first voltage is greater than a pass voltage.

14. The system of claim 12, wherein the system is a solid-state drive (SSD) or a memory card; and the command is an erase command.

15. A method for operating a memory device, the memory device comprising a source line (SL) and a bit line (BL), a memory string comprising a memory cell, and a select transistor comprising a storage layer, a word line coupled to the memory cell, and a select line coupled to the select transistor, the method comprising:
- applying a first voltage to the select line;
- applying a second voltage to at least one of the SL or the BL; and
- applying a third voltage to the word line, wherein a first peak level of the first voltage is greater than a second peak level of second voltage, and a third peak level of the third voltage is greater than the first peak level of the first voltage.

16. A non-transitory tangible storage medium storing a set of instructions, where upon being implemented by a controller, the set of instructions cause a peripheral circuit of a memory device to:
- apply a first voltage to a select line coupled to a select transistor of a memory string of the memory device;
- apply a second voltage to at least one of a source line (SL) or a bit line (BL) of the memory device; and
- applying a third voltage to a word line, wherein a first peak level of the first voltage is greater than a second peak level of second voltage, and a third peak level of the third voltage is greater than the first peak level of the first voltage.

17. The memory device of claim 1, wherein the first voltage and the third voltage are separately applied to the select line and word line at different time periods.

18. The system of claim 12, wherein the first voltage and the third voltage are overlapped in time.

19. The system of claim 12, wherein the first voltage and the third voltage are separately applied to the select line and word line at different time periods.

20. The method of claim 15, the first voltage and the third voltage are overlapped in time.

* * * * *